United States Patent
Yamamoto et al.

(10) Patent No.: US 8,435,828 B2
(45) Date of Patent: May 7, 2013

(54) METHOD OF MANUFACTURING SEMICONDUCTOR DEVICE

(75) Inventors: Hironori Yamamoto, Kanagawa (JP); Yoshihiro Hayashi, Kanagawa (JP); Jun Kawahara, Kanagawa (JP); Tatsuya Usami, Kanagawa (JP); Koichi Ohto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/006,034

(22) Filed: Jan. 13, 2011

(65) Prior Publication Data
US 2011/0171775 A1 Jul. 14, 2011

(30) Foreign Application Priority Data

Jan. 13, 2010 (JP) ................................. 2010-004539
Jun. 7, 2010 (JP) ................................. 2010-129633

(51) Int. Cl.
*H01L 51/40* (2006.01)

(52) U.S. Cl.
USPC ..................................... 438/99; 257/E51.046

(58) Field of Classification Search .................... 438/99, 438/778, 780, 781, 789, 790, 793, 794; 257/E51.046
See application file for complete search history.

(56) References Cited

U.S. PATENT DOCUMENTS

| 5,070,027 | A | 12/1991 | Mito et al. |
| 7,531,891 | B2 | 5/2009 | Ohto et al. |
| 2005/0167844 | A1 | 8/2005 | Ohto et al. |
| 2006/0286815 | A1* | 12/2006 | Aoi .............................. 438/790 |
| 2007/0048912 | A1* | 3/2007 | Noguchi et al. ............. 438/151 |
| 2009/0039474 | A1* | 2/2009 | Tada et al. .................... 257/632 |
| 2009/0246538 | A1* | 10/2009 | Yamamoto et al. ........... 428/446 |
| 2010/0025852 | A1 | 2/2010 | Ueki et al. |

FOREIGN PATENT DOCUMENTS

| JP | 2-222178 | 9/1990 |
| JP | 7-058096 | 3/1995 |
| JP | 2002-025228 | 1/2002 |
| JP | 2005-223012 | 8/2005 |
| JP | 2009-027075 | 2/2009 |
| WO | WO 2008/078649 | 7/2008 |

\* cited by examiner

*Primary Examiner* — William D Coleman
*Assistant Examiner* — Christine Enad
(74) *Attorney, Agent, or Firm* — Young & Thompson

(57) ABSTRACT

A method of manufacturing a semiconductor device includes forming a first insulating film over an underlying film by plasma polymerization of cyclic siloxane, and forming a second insulating film on the first insulating film by plasma polymerization of the cyclic siloxane continuously, after forming the first insulating film. The deposition rate of the first insulating film is slower than the deposition rate of the second insulating film.

24 Claims, 23 Drawing Sheets

Yield:99.3%

Yield:0.0%

US 8,435,828 B2

METHOD OF MANUFACTURING SEMICONDUCTOR DEVICE

This application is based on Japanese patent application Nos. 2010-004539 and 2010-129633, the content of which is incorporated hereinto by reference.

BACKGROUND

1. Technical Field

The present invention relates to a method of manufacturing a semiconductor device.

2. Related Art

In recent years, as the miniaturization of semiconductors has progressed, there have been problems relating to an interconnection delay due to parasitic capacitance as well as to an increase in power consumption. For the purpose of avoiding these, low-dielectric constants of insulating films are being advanced.

WO 2008/078649 discloses a barrier insulating film formed by plasma polymerization of cyclic siloxane including unsaturated hydrocarbon and amorphous carbon. This barrier insulating film has copper diffusion resistance, and the relative dielectric constant thereof is less than 3.5. For this reason, copper-containing interconnections are coated with this barrier insulating film, so that it is possible to reduce capacitance between interconnections without deteriorating the reliability of the copper-containing interconnections, and to realize an LSI having high speed and low power consumption.

Meanwhile, methods of forming general low-dielectric constant insulating films include Japanese Unexamined patent publication Nos. 2002-25228, H02-222178, H07-58096, 2005-223012, and 2009-27075.

SUMMARY

However, the inventors has been found that when plasma polymerization is performed in which cyclic siloxane disclosed in WO 2008/078649 pamphlet is used, there exist the film deposition conditions which cause an abnormal electrical discharge in the initial stage of film deposition. For this reason, there may be a case where the thickness of the insulating film in the initial stage of film deposition becomes nonuniform, and the thickness uniformity of the entire insulating film is deteriorated. In addition, when the insulating film is formed on a transistor, there may also be a case where damage is given to a gate insulating film due to this abnormal electrical discharge. Therefore, a technique has been required which is capable of widening the margin of the film deposition conditions, and making the insulating film low-dielectric without deteriorating reliability of the device.

In one embodiment, there is provided a method of manufacturing a semiconductor device, which includes: forming a first insulating film on an underlying film by plasma polymerization of organosiloxane having a Si—O cyclic structure; and forming a second insulating film on the first insulating film by plasma polymerization of the organosiloxane continuously after forming the first insulating film, wherein the deposition rate of the first insulating film is slower than the deposition rate of the second insulating film.

In another embodiment, there is provided a semiconductor device which includes: metal interconnections; and an insulating interlayer, having a laminated structure, made of the first insulating film and the second insulating film which are formed by the method mentioned above, wherein the insulating interlayer is formed between the metal interconnections.

In further another embodiment, there is provided a semiconductor device which includes: an underlying film; a first insulating film formed on the underlying film; and a second insulating film continuously formed over the first insulating film, wherein at least one of the first and second insulating films has cyclic siloxane, and both of the first and second insulating film include silicon, oxygen, carbon and hydrogen as constituent elements, and when the ratio of the number of carbon atoms (C) to the number of oxygen atoms (O) contained in the first and second insulating film is set as the C/O ratio, the C/O ratios of the first insulating film and the second insulating film are different from each other.

Here, the "underlying film" in the invention includes not only a film, but also a substrate.

According to the invention, when the insulating film is formed on the underlying film by plasma polymerization of organosiloxane having a Si—O cyclic structure, the deposition rate of the first insulating film at the beginning of film deposition is made slower than the deposition rate of the second insulating film at the late stage of film deposition. Thereby, since a change in impedance of the film deposition surface in the initial stage of film deposition can be caused to be slow, plasma is stabilized, and thus the generation of an abnormal electrical discharge in the initial stage of film deposition can be suppressed. Therefore, it is possible to form an insulating film having a lower relative dielectric constant without deteriorating reliability of the device. At the same time, the adhesion strength to the underlying layer is raised, and detaching and the like is reduced, so that process resistance of chemical mechanical polishing (CMP) and the like or mounting resistance is improved.

According to the invention, it is possible to form the insulating film having a lower relative dielectric constant without deteriorating reliability of the device.

BRIEF DESCRIPTION OF THE DRAWINGS

The above and other objects, advantages and features of the present invention will be more apparent from the following description of certain preferred embodiments taken in conjunction with the accompanying drawings, in which:

12A is a cross-sectional view schematically illustrating the semiconductor device of the related art, and FIG. 12B is a timing diagram of the method of manufacturing the semiconductor device of the related art.

DETAILED DESCRIPTION

Figure 1A:
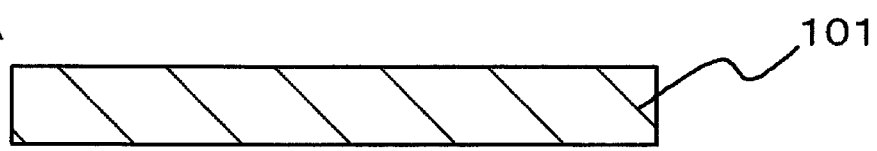
FIGS. 1A to 1C are cross-sectional views schematically illustrating a method of manufacturing a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

First Embodiment

Figure 1B:
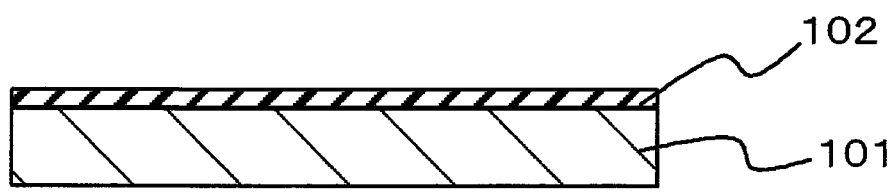
Figure 1C:
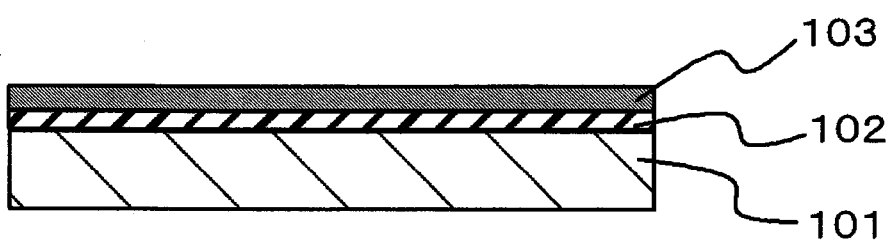

FIGS. 1A to 1C are diagrams for explaining a method of manufacturing a semiconductor device according to an embodiment. FIGS. 1A to 1C are simplified diagrams for the purpose of clearly explaining the invention, that is, the relationship between an underlying film 101, a first insulating film 102, and a second insulating film 103, and an interconnection layer (not shown), a barrier film (not shown), a cap film (not shown) and the like existing in an actual semiconductor manufacturing process. The embodiment includes forming the first insulating film 102 on the underlying film 101 by plasma polymerization of cyclic siloxane (FIG. 1B), and forming the second insulating film 103 on the first insulating film 102 by plasma polymerization of cyclic siloxane continuously after forming the first insulating film 102 (FIG. 1C). Here, the term "continuously" includes performing continuously to form the second insulating film 103 while a vacuum state is maintained after forming the first insulating film 102 and the supply of the cyclic siloxane is not stopped. For this reason, a discontinuous plane is not formed between the first insulating film 102 and the second insulating film 103. However, the boundary between the first insulating film 102 and the second insulating film 103 is shown in FIG. 1, for the purpose of explanation. In this manner, a laminated structure of the first insulating film and the second insulating film is formed. The deposition rate of the first insulating film 102 is slower than the deposition rate of the second insulating film 103.

Hereinafter, the method of manufacturing the semiconductor device according to the embodiment will be described in detail. First, the underlying film 101 is prepared (FIG. 1A).

The underlying film 101 is used as any of a conductor, a semiconductor, an insulating film or a substrate. In the embodiment, it is used as a silicon substrate.

Figure 2:
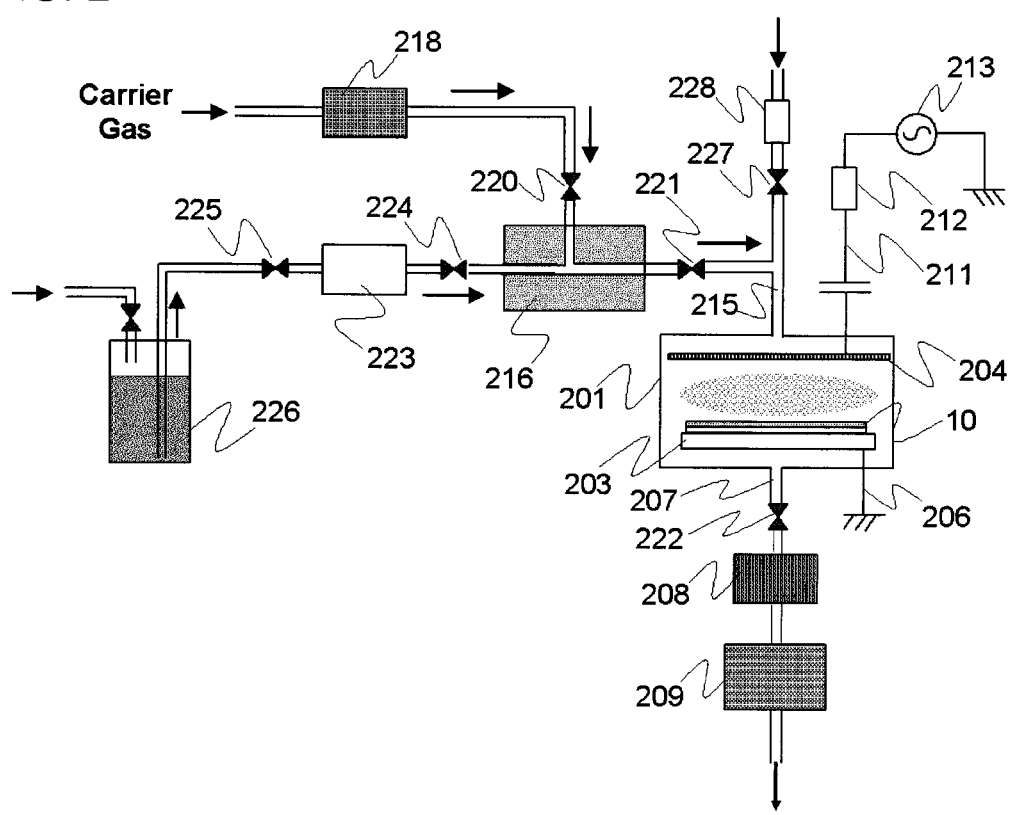
FIG. 2 is a diagram schematically illustrating a plasma generation apparatus used in the method of manufacturing of the semiconductor device according to the embodiment.

Next, the prepared underlying film 101 is put into a chamber with a plasma generation apparatus. FIG. 2 is a diagram illustrating an example of the plasma generation apparatus. A chamber 201 is connected to a vacuum pump 209 through an exhaust pipe 207, an exhaust valve 222 and a cooling trap 208. Thereby, it is possible to depressurize the inside of the chamber 201 by causing the vacuum pump 209 to operate. In addition, the vacuum in the chamber 201 is controlled by a throttle valve (not shown) installed between the chamber 201 and the vacuum pump 209, so that the pressure within the chamber 201 can also be controlled. A stage 203 having a heating function is provided inside the chamber 201. A silicon substrate 10 is disposed on the stage 203. The stage 203 is preferably heated to the temperature range of 200° C. to 400° C.

The cyclic siloxane (liquid) is pneumatically transported from a precursor reservoir tank 226 to be vaporized within a vaporizer 216, and is supplied into the chamber 201 through a valve 221 and a pipe 215. In this case, the cyclic siloxane is put into the vaporizer 216 through valves 225 and 224, and the flow rate is regulated by a liquid flow rate controller 223.

As the cyclic siloxane, organosiloxane having a Si—O cyclic structure represented by Formula (1) is used.

[Formula 1]

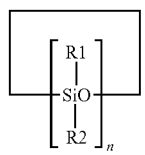

(1)

In Formula (1), R1 and R2 are hydrogen or a hydrocarbon group of the carbon number of 1 to 4, where R1 and R2 may be the same, or different form each other. Here, n is 2 to 5.

In addition, R1 and R2 in Formula (1) preferably have at least one of a linear unsaturated hydrocarbon group of the carbon number of 2 to 4 or a branched-chain saturated hydrocarbon group of the carbon number of 3 to 4. Particularly, R1 and R2 in Formula (1) are preferably any of a vinyl group, an allyl group, a methyl group, an ethyl group, a propyl group, an isopropyl group and a butyl group. In addition, n is preferably 3 or 4. Particularly, as the cyclic siloxane represented by Formula (1), exemplified are tetravinylcyclotetrasiloxane derivatives represented by Formula (2), trivinylcyclotetrasiloxane derivatives represented by Formula (3), divinylcyclotetrasiloxane derivatives represented by Formulae (4) and (5), vinylcyclotetrasiloxane derivatives represented by Formula (6), trivinylcyclotrisiloxane derivatives represented by Formula (7), divinylcyclotrisiloxane derivatives represented by Formula (8), and vinylcyclotrisiloxane derivatives represented by Formula (9).

[Formula 2]

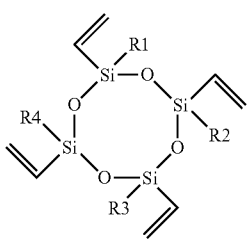

(2)

[Formula 3]

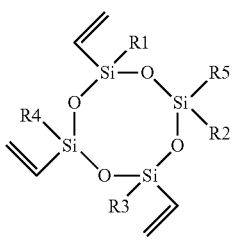

(3)

[Formula 4]

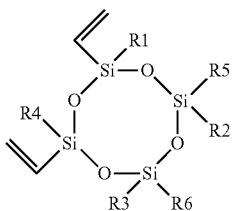

(4)

[Formula 5]

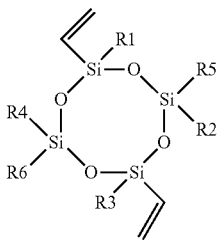

(5)

[Formula 6]

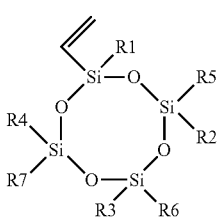

(6)

[Formula 7]

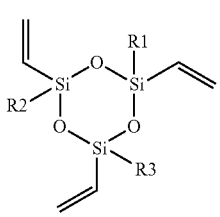

(7)

[Formula 8]

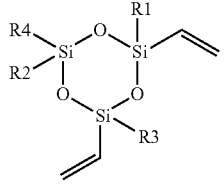

(8)

[Formula 9]

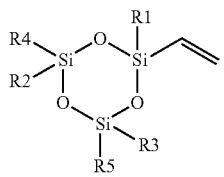

(9)

In Formula (2) to (9), R1 to R7 are hydrogen or a hydrocarbon group of the carbon number of 1 to 4, where R1 to 7 may be the same, or different from each other. R1 to R7 in Formula (2) to (9) are preferably any of a vinyl group, an allyl group, a methyl group, an ethyl group, a propyl group, an isopropyl group and a butyl group. As the cyclic siloxane, more preferably, tetravinyltetramethylcyclotetrasiloxane represented by Formula (10), and trivinyltriisopropylcyclotrisiloxane represented by Formula (11) may be used.

[Formula 10]

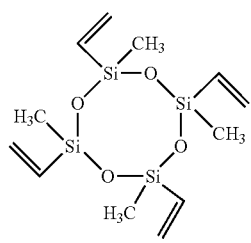

(10)

[Formula 11]

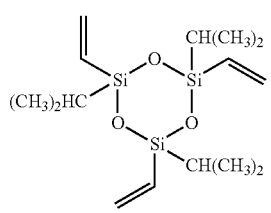

(11)

As the cyclic siloxane in the embodiment, cyclic siloxane selected from cyclic siloxanes represented by Formulae (2) to (9) may be used in one kind, or in combination of two or more kinds. When two kinds of cyclic siloxanes are used as the precursors, one cyclic siloxane may be vaporized using the vaporizer 216 as described above, another cyclic siloxane may be vaporized using a vaporizer which is different from the vaporizer 216, and two cyclic siloxanes gases may be mixed within the pipe 215 and supplied to the chamber 201. In addition, when three or more cyclic siloxanes are used, a plurality of precursor tanks (not shown), a cyclic siloxane supply pipe (not shown), a vaporization supply system (not shown), a cyclic siloxane supply pipe (not shown) and the like may be installed in the similar manner.

In addition, a carrier gas can be introduced in the pipe 215 through a gas flow controller 218 and a valve 220. Inert gases such as helium (He), argon (Ar), neon (Ne), xenon (Xe), nitrogen ($N_2$) and the like can be used as a carrier gas. In addition, oxidized gases such as oxygen ($O_2$), carbon dioxide ($CO_2$), nitrogen monoxide ($N_2O$) and nitrogen dioxide ($NO_2$) can be added through an added gas flow controller 228 and a valve 227. At the time of film deposition, a device can be simplified by using only a precursor gas (cyclic siloxane gas) and inert gases (carrier gas and excitation gas), and film deposition becomes simple through a reduction in the amount of gas to be used, which has the advantage of being easily controlled.

The pipe 215 is heated and kept warm by a heater and a heat insulation material, and prevents the vaporized cyclic siloxane from being liquefied again.

The cyclic siloxane gas and the carrier gas introduced in the chamber 201 are dispersed by a shower head 204 which includes a plurality of through-holes and is installed within the chamber 201. A gas dispersion plate, not shown, may be provided to the upper portion of the shower head.

A high-frequency power source (radio-frequency (RF) power source) 213 is connected to the shower head 204 through an electrical supply line 211 and a matching controller 212, and a high-frequency power (RF power) is supplied between the stage 203 grounded through a grounding line 206 and the shower head 204. The RF power supplied at forming the first insulating film 102 (FIG. 1B) is preferably set to be lower than that at forming the second insulating film 103 (FIG. 1c). Particularly, the RF power at forming the first insulating film 102 (FIG. 1B) is preferably set to be equal to or less than 80% of the RF power at forming the second insulating film 103.

Here, the RF power is preferably set so that the deposition rate of the first insulating film 102 is set to be equal to or less than 0.75 when the deposition rate of the second insulating film 103 mentioned below is set to 1. It is preferable that the deposition rate of the second insulating film 103 is set to be equal to or more than 120 nm/minute, and the deposition rate of the first insulating film is set to be equal to or less than 90 nm/minute. In addition, when the first insulating film 102 is formed, the in-plane uniformity of film thickness of the first insulating film 102 is preferably set to be capable of holding 4% or less. Meanwhile, the in-plane uniformity of film thickness can be measured by an in-plane distribution measurement method of the film thickness uniformity using a spectroscopic ellipsometer. The number of the measurement points of film thickness is forty-nine in total of one point on the center, eight bearings on the circle having a radius of 49 mm, sixteen bearings on the circle having a radius of 98 mm, and twenty-four bearings on the circle having a radius of 147 mm, in the case of a wafer having a diameter of 300 mm. The in-plane uniformity of film thickness is defined as represented by the following numerical expression (1).

In-plane uniformity of film thickness (%)={(maximum film thickness of measurement point−minimum film thickness of measurement point)/average film thickness/2}×100    (1)

The cyclic siloxane gas and the carrier gas introduced in the chamber 201 become a plasma state by power applied between the shower head 204 and the stage 203, and are deposited on the surface of the silicon substrate 10 disposed on the stage 203 to form the first insulating film 102.

Next, at the timing at which the surface of the underlying film 101 is covered with the first insulating film 102, an output of the RF power source 213 is raised to thereby increase the RF power supplied. In this manner, formation of the second insulating film 103 on the surface of the first insulating film 102 starts. Specifically, it is preferable to raise the RF power at the timing at which the first insulating film 102 has a thickness of equal to or more than 10 nm. As described above, in the embodiment, the first insulating film 102 is formed, the film is not extracted from the chamber 201, and then the second insulating film 103 is continuously formed on the surface of the first insulating film 102. Thereby, after forming the first insulating film 102, the second insulating film 103 is "continuously" formed. In this manner, a laminated structure of the first insulating film and the second insulating film is formed. Meanwhile, the in-plane uniformity of film thickness of the first insulating film 102 at a point of time at starting to form the second insulating film 103 is equal to or less than 4%.

Figure 3:
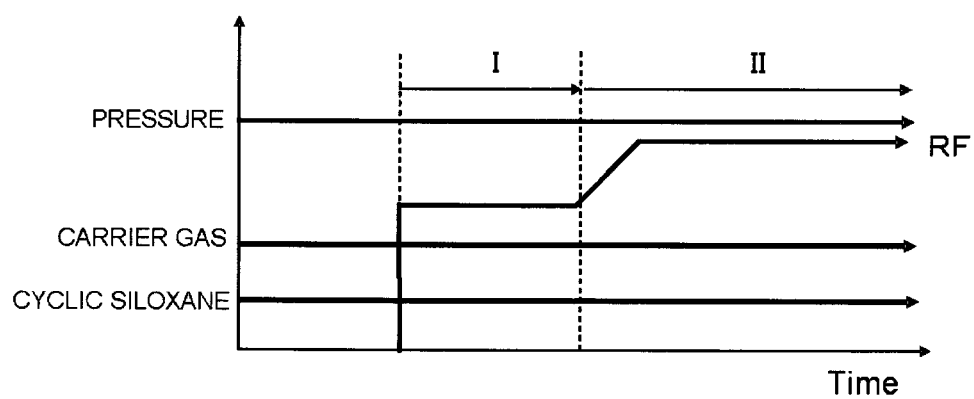
FIG. 3 is a timing diagram of the method of manufacturing the semiconductor device according to a first embodiment.

FIG. 3 shows a timing diagram of forming the first insulating film 102 and the second insulating film 103. I region in FIG. 3 shows to form the first insulating film 102, and II region in the same drawing shows to form the second insulating film 103.

The gas flow rate of the cyclic siloxane and the gas flow rate of the carrier gas are kept constant throughout forming the first insulating film 102 and the second insulating film 103 by control of the flow rate controller. Here, the carrier gas and the cyclic siloxane gas introduced into the chamber may have a ratio (a/b) of the gas flow rate (a) of the cyclic siloxane to the flow rate (b) of the carrier gas set to 0.05 to 0.6. In addition, the pressure within the chamber 201 is constantly controlled by the vacuum pump 209 and the like. As shown in FIG. 3, only the RF power is gradually raised after forming the first insulating film 102, and maintains a constant state until the second insulating film 103 having a desired thickness is formed. It is preferable that the RF power increases the deposition rate of the second insulating film 103 to be a deposition rate faster than the deposition rate of the first insulating film 102 by 30 nm/minute or more.

Here, it is preferable to gradually raise the RF power in the initial stage of film deposition of the second insulating film 103 in consideration of plasma stability within the chamber 201. However, the deposition rate of the second insulating film 103 is preferably made constant in order to make the composition of the second insulating film 103 uniform. Therefore, the rate of increase of the RF power is preferably controlled in the range which does not impair plasma stability within the chamber 201, in order to make the composition of the second insulating film 103 uniform.

The ratio (C/Si) of the number of carbon atoms (C) to the number of silicon atoms (Si) in the first insulating film 102 formed in this manner becomes higher than C/Si in the second insulating film 103.

In addition, the ratio (O/Si) of the number of oxygen atoms (O) to the number of silicon atoms (Si) in the first insulating film 102 becomes lower than O/Si in the second insulating film 103.

As mentioned above, the semiconductor device is accomplished by introducing the described method when the low-dielectric constant insulating film of the semiconductor device is formed. Thereby, the semiconductor device is obtained which includes the first insulating film 102, and the second insulating film 103 continuously formed on the first insulating film 102. In both the first and the second insulating films 102 and 103, silicon, oxygen, carbon and hydrogen are used as main constituent elements. In addition, the cyclic siloxane remains in the first and second insulating films 102 and 103 and pores are formed therein. In addition, since forming the second insulating film 103 on the first insulating film 102 is continuously performed without extraction from the vacuum chamber, the first and second insulating films 102 and 103 do not have a discontinuous plane. For this reason, in the first and second insulating films 102 and 103, a porous insulating film is integrally formed. The relative dielectric constant of this porous insulating film is set to be equal to or less than 2.7. A film having a higher C/Si ratio than that of the low-dielectric constant film of the related art is formed by using the cyclic siloxane. In addition, the ratio (C/O) of the number of carbon atoms (C) to the number of oxygen atoms (O) in the first insulating film 102 becomes higher than that in the second insulating film 103. For example, the C/O ratio in the first insulating film 102 can be set to 3.86, and the C/O ratio in the second insulating film 103 can be set to 3.38.

Since the pores within the first and second insulating films 102 and 103 are formed by using a chemical structure of film materials, a porous insulating film having a smaller diameter than that of the related art is obtained. For example, the maximum diameter of the pore measured by a small-angle X-ray scattering method can be set to be equal to or less than 1.5 nm, more preferably, equal to or less than 1.0 nm, the mean value can be set to be equal to or less than 0.5 nm, and the half-value width can be set to 0.3 nm to 0.5 nm. Meanwhile, since the interface between the first insulating film 102 and the second insulating film 103 is formed to have a continuity plane, there is no concern that the adhesion strength between the insulating films decreases.

Subsequently, the advantage of the method of manufacturing the semiconductor device according to the embodiment will be described. According to this method, when the insulating film is formed on the underlying film 101 by plasma polymerization of the cyclic siloxane, the deposition rate of the first insulating film 102 at the start of film deposition is made slower than the deposition rate of the second insulating film 103 at the late stage of film deposition. Thereby, since a change in impedance of the film deposition surface in the initial stage of film deposition can be caused to be slow, plasma is stabilized, and thus the generation of an abnormal electrical discharge in the initial stage of film deposition can be suppressed. Therefore, it is possible to form an insulating film having a lower relative dielectric constant without deteriorating reliability of the device.

According to the cyclic siloxane having hydrocarbon groups at the side chain represented in the above-mentioned Formula (1), the porous insulating film having a high C/Si ratio can be formed. Therefore, it is expected that the insulating film having a lower relative dielectric constant than that of the related art is formed. However, in the film deposition method using the cyclic siloxane with plasma, the dissociation state in the plasma is easily affected by the conditions and thus a large variety of active species are generated. Thereby, the plasma becomes easily unstable. Particularly, in the initial stage of film deposition, impedances are greatly different between the underlying film 101 and the insulating film to be formed, the plasma becomes further unstable, and thus the abnormal electrical discharge arises. Such an abnormal electrical discharge causes deterioration of the dielectric breakdown voltage of the gate oxide film of the semiconductor device. Since the unstable plasma state changes from moment to moment, there is a case where the film thickness at the initial stage of film deposition becomes easily nonuniform. As a result, the film thickness at the initial stage of film deposition becomes nonuniform, so that the thickness of the entire insulating film becomes nonuniform, and thus performance of the device is degraded.

However, in the embodiment, the RF power is reduced in the initial stage of film deposition, so that the generation of the active species in the initial stage of film deposition is suppressed, and plasma polymerization hardly arises. Therefore, it is possible to reduce the film deposition rate in the initial stage of film deposition of the cyclic siloxane. Thereby, it is possible to slow the impedance change in the film deposition surface, and to further stabilize the plasma state by suppressing a sudden change in the plasma. In this manner, it is possible to form the insulating film having a uniform thickness in the initial stage of film deposition.

Second Embodiment

The embodiment is also a method of manufacturing the semiconductor device. In the embodiment, only the points which are different from those of the first embodiment will be described, and identical contents will not be repeated. Even in the embodiment, as shown in FIGS. 1A to 1C, the first insulating film 102 is formed on the underlying film 101 by plasma polymerization of the cyclic siloxane, and the second insulating film 103 is continuously formed on the first insulating film 102 by plasma polymerization of the cyclic siloxane. In this manner, a laminated structure of the first insulating film and the second insulating film is formed. In the first embodiment, the film deposition rate is controlled by the RF power. However, in the embodiment, the ratio ($a_2/(b_2+c_2)$) of the gas flow rate ($a_2$) of the cyclic siloxane to the sum ($b_2+c_2$) of the flow rate ($b_2$) of the carrier gas and the flow rate ($c_2$) of the excitation gas at forming the second insulating film 103 (FIG. 1C) is set to be larger than the ratio ($a_1/(b_1+c_1)$) of the gas flow rate ($a_1$) of the cyclic siloxane to the sum ($b_1+c_1$) of the flow rate ($b_1$) of the carrier gas and the flow rate ($c_1$) of the excitation gas at forming the first insulating film 102 (FIG. 1B), and thus the film deposition rate is controlled.

Figure 4:
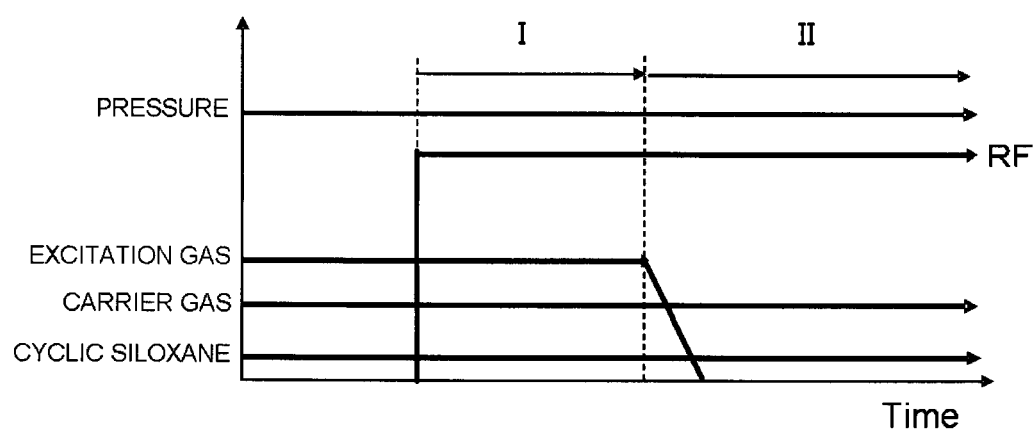
FIG. 4 is a timing diagram of the method of manufacturing the semiconductor device according to a second embodiment.

Specifically, the manufacturing method according to the embodiment is shown by the timing diagram of FIG. 4. As shown in FIG. 4, the pressure, the RF power and the flow rate of the cyclic siloxane within the chamber 201 are constant throughout forming the first insulating film 102 (I) and the second insulating film 103 (II). Moreover, in the embodiment, the carrier gas and the excitation gas are put into the chamber 201. Although inert gases such as helium (He), argon (Ar), neon (Ne), xenon (Xe), and nitrogen ($N_2$) can be used as both the carrier gas and the excitation gas, the same composition is more preferably used. Although the flow rate of the carrier gas is set to be constant throughout forming the first insulating film 102 and the second insulating film 103, the flow rate of the excitation gas is set to 0 in the initial stage of film deposition of the second insulating film 103 by gradually reducing the flow rate after the first insulating film 102 is formed to 10 nm or more. For example, the flow rate of the excitation gas can be set to two to three times or so the flow rate of the carrier gas.

Specifically, when the first insulating film 102 (I) is formed, the ratio ($a_1/(b_1+c_1)$) of the gas flow rate ($a_1$) of the cyclic siloxane to the sum ($b_1+c_1$) of the flow rate ($b_1$) of the carrier gas and the flow rate ($c_1$) of the excitation gas is preferably set to be equal to or less than 0.15, more preferably equal to or less than 0.1. Here, $b_1$ is calculated as a flow rate in which the excitation gas and the carrier gas are mixed.

Moreover, when the second insulating film 103 (II) is formed, the mixing ratio ($a_2/(b_2+c_2)$) of the gas flow rate ($a_2$) of the cyclic siloxane to the sum ($b_2+c_2$) of the flow rate ($b_2$) of the carrier gas and the flow rate ($c_2$) of the excitation gas may be set to be equal to or more than 0.2. For example, the flow rate of the excitation gas is set to zero by gradually reducing the flow rate of the excitation gas for a predetermined period of time after starting to form the second insulating film 103. In this manner, the mixing ratio ($a_2/(b_2+c_2)$) of the gas flow rate ($a_2$) of the cyclic siloxane to the sum ($b_2+c_2$) of the flow rate of the excitation gas and the flow rate of the carrier gas can be set to be equal to or more than 0.2.

The ratio (C/Si) of the number of carbon atoms (C) to the number of silicon atoms (Si) in the first insulating film 102 formed in this manner is lower than C/Si in the second insulating film 103. This is because the cyclic siloxane collides with the carrier gas to thereby be easily dissociated, and thus at the same time the valance of Si increases, that is, oxidation proceeds. Therefore, the first insulating film 102 becomes more rigid than the second insulating film 103. For this reason, adhesion to the underlying film 101 is improved. In addition, the oxygen/silicon ratio (O/Si) of the first insulating film 102 becomes higher than O/Si of the second insulating film 103. Therefore, the first insulating film 102 is superior to the second insulating film 103 in film strength. In addition, the C/O ratio of the first insulating film 102 is lower than the C/O ratio of the second insulating film 103. For example, the C/O ratio of the first insulating film 102 can be set to be in a range of equal to or more than 3.14 and equal to or less than 3.29, and the C/O ratio of the second insulating film 103 can be set to be in a range of equal to or more than 3.38 and equal to or less than 4.17.

For example, the film deposition rate in I region of FIG. 4 can be set to 0.8 times the film deposition rate in II region of FIG. 4. In this case, it is confirmed that the first insulating film 102 has a relative dielectric constant of 2.7 and a maximum pore diameter of 1.0 nm, and the film composition thereof obtained by the X-ray photoelectron spectroscopy (XPS) measurement has a C/Si ratio of 2.2 and an O/Si ratio of 0.7. In addition, it is confirmed that the second insulating film 103 has a relative dielectric constant of 2.55 and a maximum pore diameter of 0.36 nm, and the film composition thereof has a C/Si ratio of 2.7 and an O/Si ratio of 0.8.

Even in the method according to this embodiment, since the film deposition rate in the initial stage of film deposition of the low-dielectric constant insulating film can be reduced, the same effect as that of the first embodiment can be obtained. In the embodiment, since the frequency of collision of the cyclic siloxane gas with the carrier gas increases, the cyclic siloxane is easily dissociated. However, since the absolute amount of the cyclic siloxane used is small, there is little concern that the plasma becomes unstable. In addition, since adhesion to the underlying film is strong, and the insulating film having a high strength can be formed, resistance of chemical mechanical polishing (CMP) and the like to a physical impact becomes high, and thus the yield is improved.

Third Embodiment

In the embodiment, only the points different from those of the first and second embodiments will be described, and identical contents will not be repeated. In the embodiment, when any of the first insulating film 102 and the second insulating film 103 is/are formed, an oxidized gas is supplied to the chamber 201 shown in FIG. 2 together with organosiloxane. In the embodiment, the carrier gas and the excitation gas can be used together with the cyclic siloxane gas and the oxidized gas. Oxygen ($O_2$), carbon dioxide ($CO_2$), nitrogen monoxide ($N_2O$) and nitrogen dioxide ($NO_2$) and the like can be used in the oxidized gas.

Figure 15:
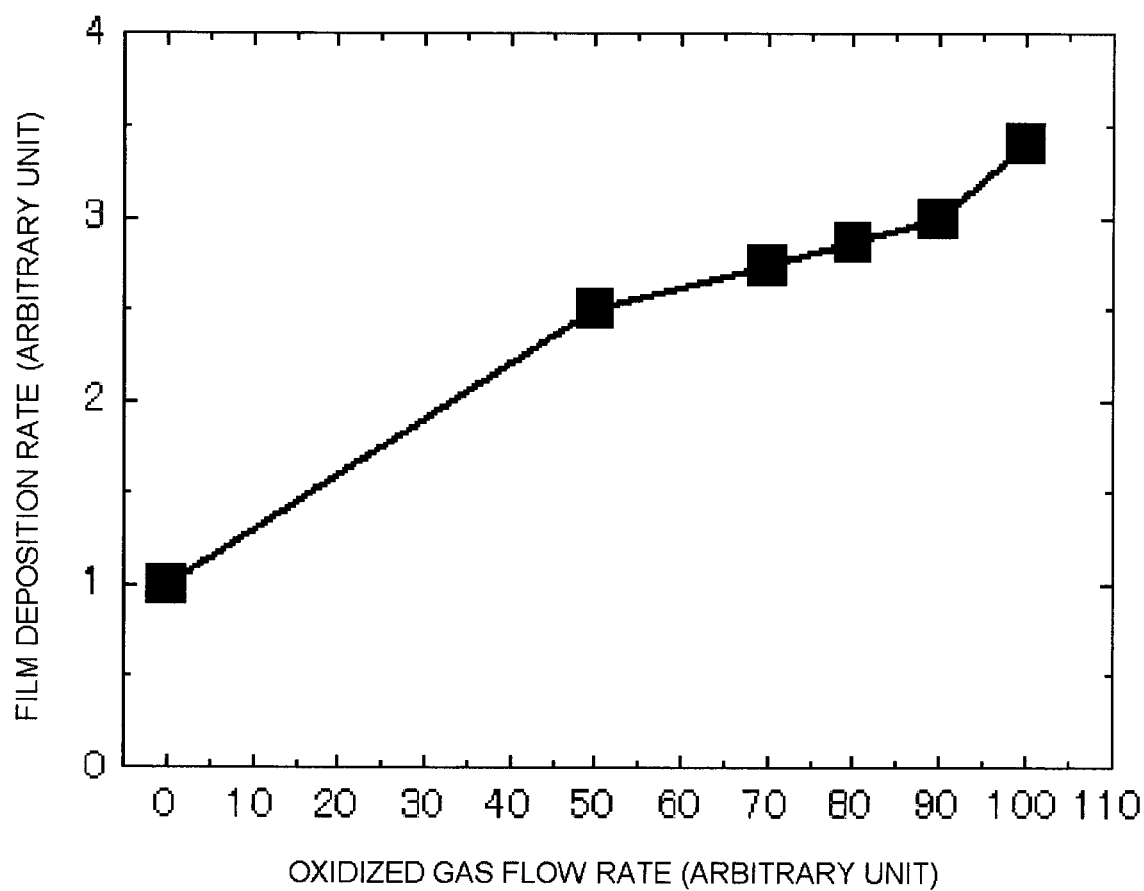
FIG. 15 is a graph illustrating the relationship of a film deposition rate to the addition amount of oxidized gas.

The film deposition rate can be improved by addition of the oxidized gas as shown in FIG. 15. Thereby, merits of the improvement in throughput and the reduction in the amount of the precursors used are generated, and thus an additional effect of the reduction in price can be expected.

Figure 14:
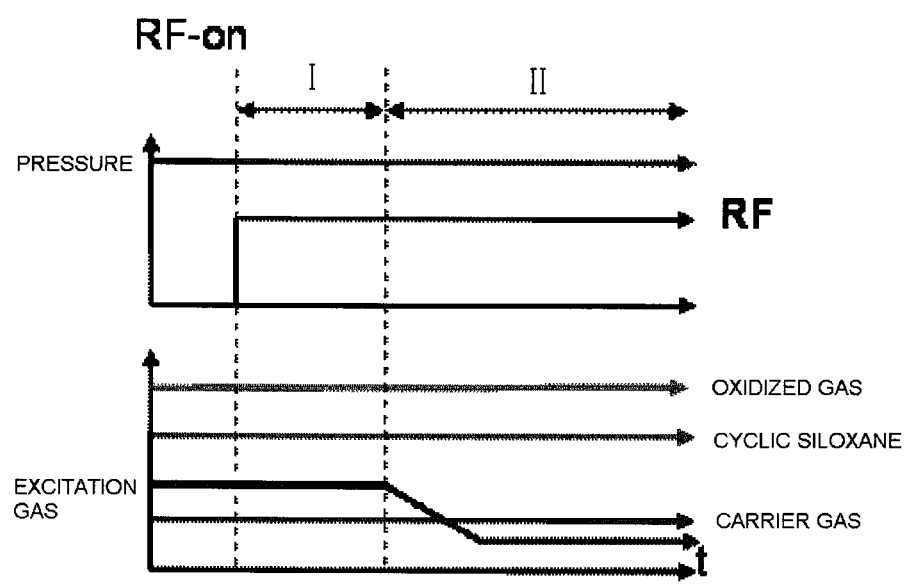
FIG. 14 is a timing diagram of the method of manufacturing the semiconductor device according to a fourth embodiment.

The manufacturing method according to the embodiment is shown by a timing diagram of FIG. 14. As shown in FIG. 14, the pressure, the RF power, the flow rate of the oxidized gas and the flow rate of the cyclic siloxane within the chamber 201 are constant throughout forming the first insulating film 102 (I) and the second insulating film 103 (II). Moreover, in the embodiment, the carrier gas and the excitation gas are put into the chamber 201. Although inert gases such as any of helium (He), argon (Ar), neon (Ne), xenon (Xe), and nitrogen ($N_2$) can be used as both the carrier gas and the excitation gas, it is more preferable to use the same composition. Although the flow rate of the carrier gas is set to be constant throughout forming the first insulating film 102 and the second insulating film 103, the flow rate of the excitation gas is set to 0 in the initial stage of film deposition of the second insulating film 103 by gradually reducing the flow rate after the first insulating film 102 is formed at 10 nm or more. For example, the flow rate of the excitation gas can be set to two to three times the flow rate of the carrier gas.

Additionally, in the embodiment, as shown in FIGS. 1A to 1C, the first insulating film 102 is formed on the underlying film 101 by plasma polymerization of the cyclic siloxane, and the second insulating film 103 is continuously formed on the first insulating film 102 by plasma polymerization of the cyclic siloxane.

Specifically, in forming the first insulating film 102 (I), the ratio ($a_1/b_1$) of the gas flow rate ($a_1$) of the cyclic siloxane to be supplied to the sum ($b_1$) of the excitation gas flow rate and the carrier gas flow rate is preferably set to be equal to or less than 0.15; more preferably equal to or less than 0.1. Here, $b_1$ is calculated as a flow rate in which the excitation gas and the carrier gas are mixed.

In addition, the pressure within the chamber 201 is constantly controlled by the vacuum pump 209 and the like. As shown in FIG. 14, only the excitation gas flow rate gradually decreases after forming the first insulating film 102, and maintains a constant state until the second insulating film 103 having a desired thickness is formed. The excitation gas flow rate is preferably set so as to increase the deposition rate of the second insulating film 103 to be a deposition rate faster than the deposition rate of the first insulating film 102 by 30 nm/minute or more.

Here, it is preferable to gradually decrease the excitation gas flow rate in the initial stage of film deposition of the second insulating film 103 in consideration of plasma stability within the chamber 201. However, the deposition rate of the second insulating film 103 is preferably made constant in order to make the composition of the second insulating film 103 uniform. Therefore, the flow reduction rate of the excitation gas is preferably controlled in the range which does not impair plasma stability within the chamber 201 in order to make the composition of the second insulating film 103 uniform.

The ratio (C/Si) of the number of carbon atoms (C) to the number of silicon atoms (Si) in the first insulating film 102 formed in this manner is lower than C/Si in the second insulating film 103. This is because the cyclic siloxane collides with the carrier gas to thereby be easily dissociated, and thus at the same time the valance of Si increases, that is, oxidation proceeds. Therefore, the first insulating film 102 becomes more rigid than the second insulating film 103. For this reason, adhesion to the underlying film 101 is improved. In addition, the oxygen/silicon ratio (O/Si) of the first insulating film 102 becomes higher than O/Si of the second insulating film 103. Therefore, the first insulating film 102 is superior to the second insulating film 103 in film strength. In addition, the C/O ratio of the first insulating film 102 is lower than the C/O ratio of the second insulating film 103.

Subsequently, the advantage of the method of manufacturing the semiconductor device of this embodiment will be described. According to this method, it is possible to improve the film deposition rate by introducing the oxidized gas at the time of forming the first insulating film 102, and at the time of forming the second insulating film 103. In addition, it is possible to realize the high-speed film deposition, with adhesion strength being maintained, by controlling the flow rate of the oxidized gas with respect to the excitation gas and the carrier gas.

Moreover, even in the method of this embodiment, since the film deposition rate in the initial stage of film deposition of the low-dielectric constant insulating film can be reduced, the same effect as that of the first embodiment can be obtained. In the embodiment, since the frequency of collision of the cyclic siloxane gas with the carrier gas increases, the cyclic siloxane is easily dissociated. However, since the absolute amount of the cyclic siloxane used is small, there is little concern that the plasma will become unstable. In addition, since adhesion to the underlying film is good, and the insulating film having a high strength can be formed, the resistance of chemical mechanical polishing (CMP) and the like to a physical impact becomes high, whereby the yield is improved.

Fourth Embodiment

The embodiment is a method of manufacturing the semiconductor device in which the first embodiment is used. The embodiment will be described with reference to FIGS. 5A to 5I.

Figure 5A:
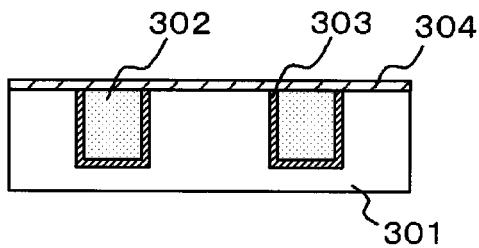
FIGS. 5A to 5I are cross-sectional views schematically illustrating the method of manufacturing of the semiconductor device according to a third embodiment.

FIG. 5A shows a lower layer interconnection on which an upper layer interconnection is formed. As shown in the drawing, the lower layer interconnection includes an insulating interlayer 301, a copper (Cu)-based metal interconnection 302 embedded in the insulating interlayer 301, and a barrier insulating film 304 laminated on the insulating interlayer 301 so as to cover the metal interconnection 302. A barrier metal film 303 is formed between the insulating interlayer 301 and the metal interconnection 302. The portion of the lower layer interconnection can also be formed using the same process as that of the upper layer interconnection shown below.

Figure 5F:
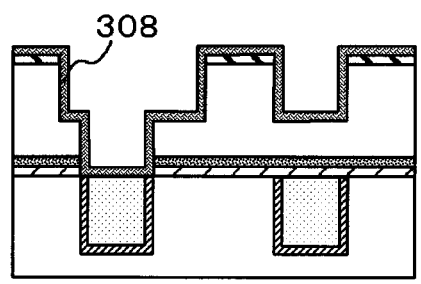
Figure 5B:
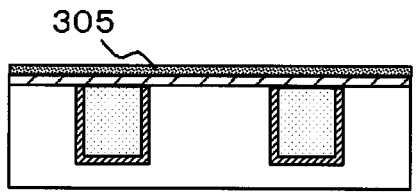

Next, a first insulating film 305 is formed by a plasma CVD method or plasma polymerization reaction (FIG. 5B). The deposition rate of this first insulating film 305 is preferably set to be equal to or less than 90 nm/minute. Meanwhile, the first insulating film 305 corresponds to the first insulating film 102 of the first embodiment.

Here, the surface of the barrier insulating film 304 may be plasma-processed before the first insulating film 305 is formed. The inert gases are preferably used as a gas for performing this plasma processing. Although helium (He), argon and nitrogen can be used, helium is more preferably used. The barrier insulating film 304 preferably includes at least silicon (Si) and carbon (C) as constituent elements. Specifically, a SiCN film, a SiC film, and further a laminated film thereof can be used in the barrier insulating film. When the ratio of the number of carbon atoms (C) to the number of silicon atoms (Si) contained in the barrier insulating film 304 is set as a C/Si ratio, the C/Si ratio of the composition ratio of the barrier insulating film 304 can normally be set to be equal to or more than 0.8 and equal to or less than 1.5. However, since carbon is broken away by plasma-processing the surface of the barrier insulating film 304, the C/Si ratio of the barrier insulating film in the interface of the barrier insulating film 304 can be made lower than the C/Si ratio inside the barrier insulating film 304. For example, when a SiCN film is used as the barrier insulating film 304, and the surface of this SiCN film is processed using helium plasma, the C/Si ratio in the vicinity of the surface can be set to be equal to or more than 0.5 and equal to or less than 1.4. The first insulating film 305 is formed on such a barrier insulating film 304, so that the barrier insulating film 304 in the interface between the barrier insulating film 304 and the first insulating film 305 has a smaller C/Si ratio than that of the inside (bulk middle) of the barrier insulating film 304. Processing for reducing the carbon composition of the surface of this barrier insulating film 304 is effective in improving adhesion between the barrier insulating film 304 and the first insulating film 305.

Figure 5G:
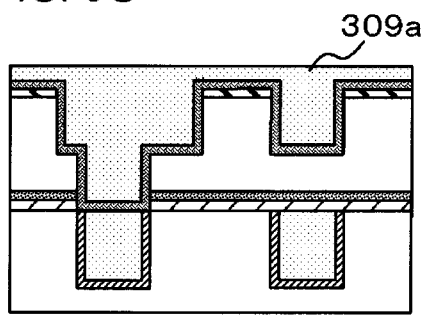
Figure 5C:
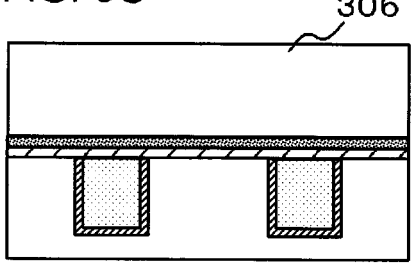

Referring back to FIG. 5B, after the first insulating film 305 is formed to have a thickness of 10 nm or more, a second insulating film 306 is continuously formed on the first insulating film 305 (FIG. 5C). Switching of formation from the first insulating film 305 to the second insulating film 306 is performed by raising the RF output as shown by the timing diagram of FIG. 3, or reducing the excitation gas flow rate as shown by the timing diagrams of FIG. 4 or FIG. 14, and the deposition rate of the second insulating film 306 becomes faster than the deposition rate of the first insulating film 305. Although a discontinuous plane is not formed in the first insulating film 305 and the second insulating film 306, the boundary is shown in FIGS. 5A to 5I for the purpose of explanation. The second insulating film 306 corresponds to the second insulating film 103 of the first embodiment. In addition, a laminated structure in which the first insulating film 305 and the second insulating film 306 are put together can also be called an insulating interlayer.

Meanwhile, the first insulating film 305 and the second insulating film 306 can also be formed using the plasma generation apparatus of FIG. 2. The pressure, the flow rate of the cyclic siloxane and the flow rate of the carrier gas within the chamber 201 are made constant according to the timing diagram of FIG. 3 described in the first embodiment.

Figure 5H:
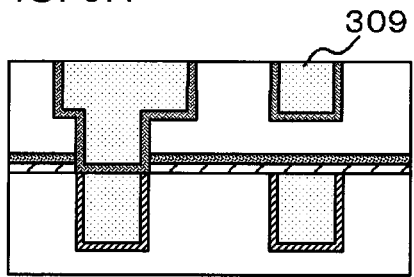
Figure 5D:
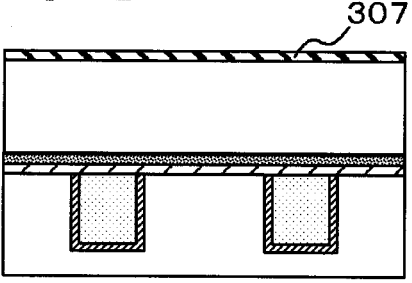

Thereafter, when CMP is performed, a hard mask 307 serving as a protective film of the second insulating film 306 is formed (FIG. 5D). As the hard mask 307, for example, a silicon oxide film ($SiO_2$), made from a silane or a tetraethoxysilane (TEOS), a relatively rigid (elastic modulus of 10 GPa or more) SiOC film, or a SiOCH film is used. Next, a via-hole and a trench are formed in the insulating film by lithography and anisotropic etching (FIG. 5E).

Thereafter, a barrier metal film 308 is formed (FIG. 5F). The barrier metal film shows a conductive film, having a barrier property, for coating the lateral side and the bottom of the interconnection, in order to prevent metal elements included in the interconnection from being diffused to the insulating interlayer or the lower layer. For example, when the interconnection is made of a Cu-based metal element, high melting point metals such as tantalum (Ta), tantalum nitride (TaN), titanium nitride (TiN), and tungsten carbonitride (WCN), nitrides thereof and the like, or a laminated film thereof is used.

Next, a metal interconnection material 309a is embedded in the interconnection groove and the interconnection hole (FIG. 5G). The metal interconnection material 309a is a Cu-based metallic material. Metal elements other than Cu may be contained in a member made of Cu for the purpose of improving reliability of the metal interconnection material 309a. In addition, the upper surface and the lateral side of the metal interconnection material 309a may be formed by the metal elements other than Cu.

Next, heat treatment for Cu grain growth is performed. The temperature of this heat treatment is set to 200° C. to 400° C., and the time thereof is set to thirty seconds to one hour. However, this temperature is preferably set to be equal to or less than the formation temperature of the first and second insulating films. Subsequently, the metal interconnection material 309a and the barrier metal film 308, which are redundant, and the hard mask 307 other than the interconnection groove and the interconnection hole are removed using polishing techniques such as CMP (FIG. 5H).

Figure 5I:
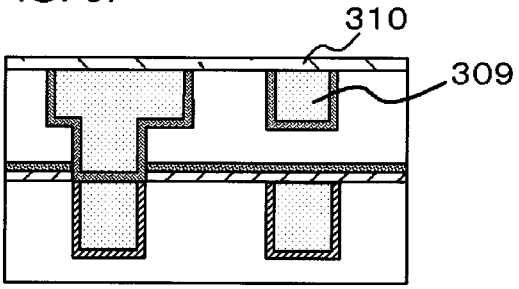
Figure 5E:
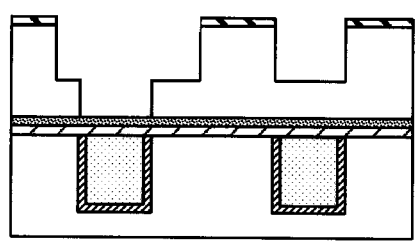

A barrier insulating film 310 is further formed thereon (FIG. 5I). The barrier insulating film 310 is formed on the upper surface of the metal interconnection 309. The barrier insulating film has a function of preventing oxidation of Cu in the metal interconnection 309 or diffusion of Cu into the insulating film, and a role as an etching stopper film at the time of processing. For example, a SiC film, a SiCN film, a SiN film, CoWP, CoWB, CoSnP, CoSnB, NiB, NiMoB and the like are used. An upper interconnection layer and a via layer can be formed by repeatedly performing the process of FIGS. 5A to 5I. In addition, although the above-mentioned process are described using a dual damascene method in which the via-hole and the trench are simultaneously formed, the example is similarly applied to the formation of the interconnection layer and the via layer when a single damascene method is used. Meanwhile, a method of forming the insulating interlayer of the embodiment may be applied to at least one of the interconnection layer or the via layer, and may also be applied to any of the interconnection layer and the via layer.

Figure 12A:
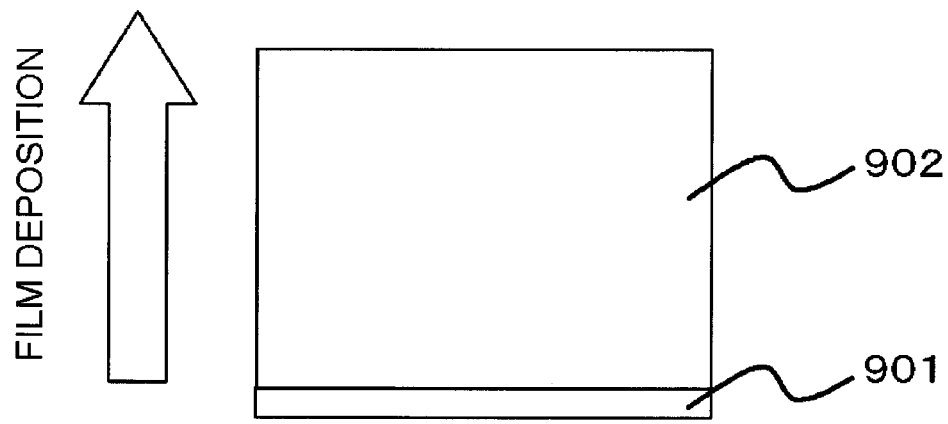
FIGS. 12A and 12B are diagrams illustrating a method of manufacturing a semiconductor device of the related art. FIG.
Figure 12B:
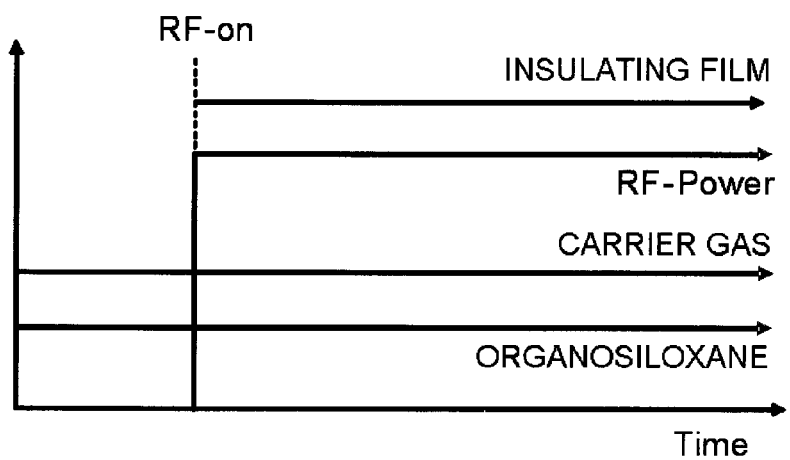
Figure 13:
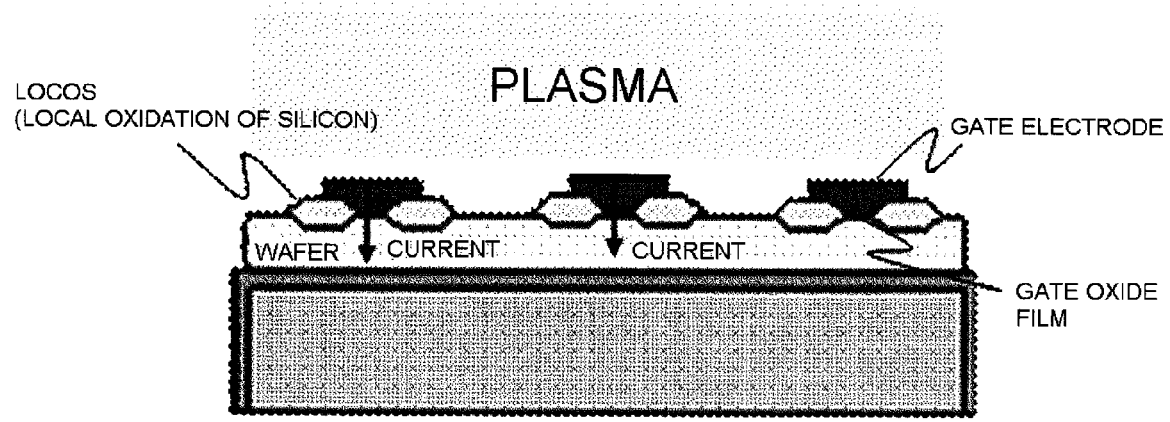
FIG. 13 is a diagram for explaining the method of manufacturing the semiconductor device of the related art.

In the related art, an insulating film 902 is formed on an underlying film 901 such as a barrier insulating layer by plasma polymerization of the cyclic siloxane according to a timing diagram shown in FIG. 12B (FIG. 12A). When doing so, in the initial stage of film deposition, there is a case where plasma is unstable and thus an abnormal electrical discharge is generated. Since this abnormal electrical discharge causes a current (or electrons) to flow into a silicon substrate (wafer in FIG. 13) through a gate insulating film as shown in FIG. 13, there is a case where insulation resistance of the gate insulating film is deteriorated. Thereby, since reliability of the device decreases, it is not possible to achieve a low-dielectric constant of the insulating film by the cyclic siloxane while maintaining reliability of the device.

On the other hand, in the method according to the embodiment, in forming the insulating interlayer in which the cyclic siloxane is used, when the film deposition rate is set to be equal to or less than 90 nm/minute in the initial stage of film deposition, the film deposition rate is raised after the underlying film is covered with the insulating film. In this manner, it is possible to prevent the abnormal electrical discharge from being generated by stabilizing the plasma state. Therefore, it is possible to achieve a low-dielectric constant of the insulating film using the cyclic siloxane while maintaining reliability of the device, and to improve characteristics of the device.

Moreover, in the first insulating film 305 and the second insulating film 306, the film composition can be changed by controlling the film deposition rate. In this manner, when a trench for forming a copper interconnection is formed within the second insulating film 306, a trench having a desired depth can be formed by detecting a change in the etching rate.

Meanwhile, as a method of forming the first insulating film 305 and the second insulating film 306 in the embodiment, methods of a second or third embodiment may be used by the substitution for the method of the first embodiment. That is, the film deposition rate may be controlled by controlling the mixing ratio of the carrier gas and the cyclic siloxane gas by the substitution for control of the film deposition rate through control of the RF power.

As mentioned above, although the embodiments of the invention have been set forth with reference to the drawings, they are merely illustrative of the invention, and various configurations other than those stated above can be adopted. For example, in the plasma generation apparatus shown in FIG. 2, the carrier gas and the excitation gas are respectively introduced into the chamber through the different pipes. However, after the carrier gas and the excitation gas are mixed, they may be introduced into the vaporizer.

EXAMPLES

Example 1

Figure 6A:
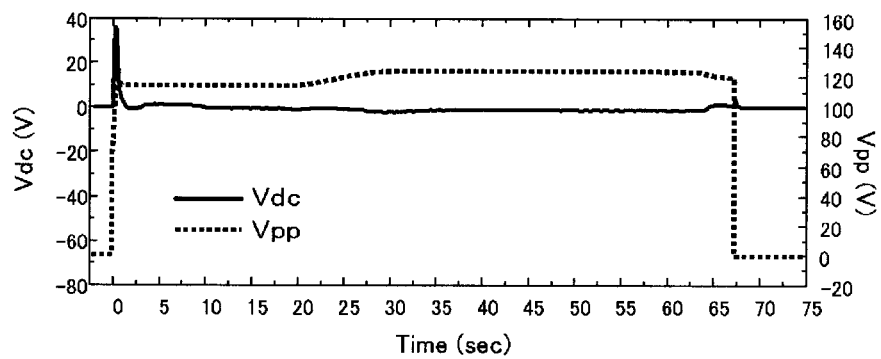
FIG. 6A is a diagram illustrating an example.

The first insulating film 102 and the second insulating film 103 were formed according to the timing diagram of FIG. 3 using the configuration shown in FIGS. 1A to 1C. As the plasma generation apparatus, an apparatus shown in FIG. 2 was used. In the example, a silicon substrate was used as the underlying film 101 in order to perform the measurement of the film thickness uniformity more simply. Trivinyltriisopropylcyclotrisiloxane represented by the above-mentioned Formula (11) was used as the cyclic siloxane, and a He gas was used as the carrier gas. The pressure within the chamber was maintained at 280 Pa. In I region of FIG. 3, the RF power was controlled so as to have a film deposition rate of 90 nm/minute, and the first insulating film 102 was formed to have a thickness of 10 nm. At this time, in the in-plane distribution measurement of the film thickness uniformity in which a spectroscopic ellipsometer was used, the in-plane uniformity of thickness of the first insulating film 102 was 4%. Thereafter, the film deposition rate was set to 120 nm/minute for ten seconds, and the formation of the second insulating film 103 was started. That is, the film deposition rate in I region of FIG. 3 is 0.75 times the film deposition rate in II region of FIG. 3. In addition, the difference therebetween is 30 nm/minute. When the second insulating film 102 having a film thickness of 100 nm was formed, the in-plane distribution of the film thickness uniformity was measured. In the result, the in-plane uniformity of film thickness was 3%. When temporal changes in the high-frequency voltage amplitude Vpp and the self-bias Vdc were examined, the abnormal electrical discharge was not confirmed as shown in FIG. 6A.

Figure 7:
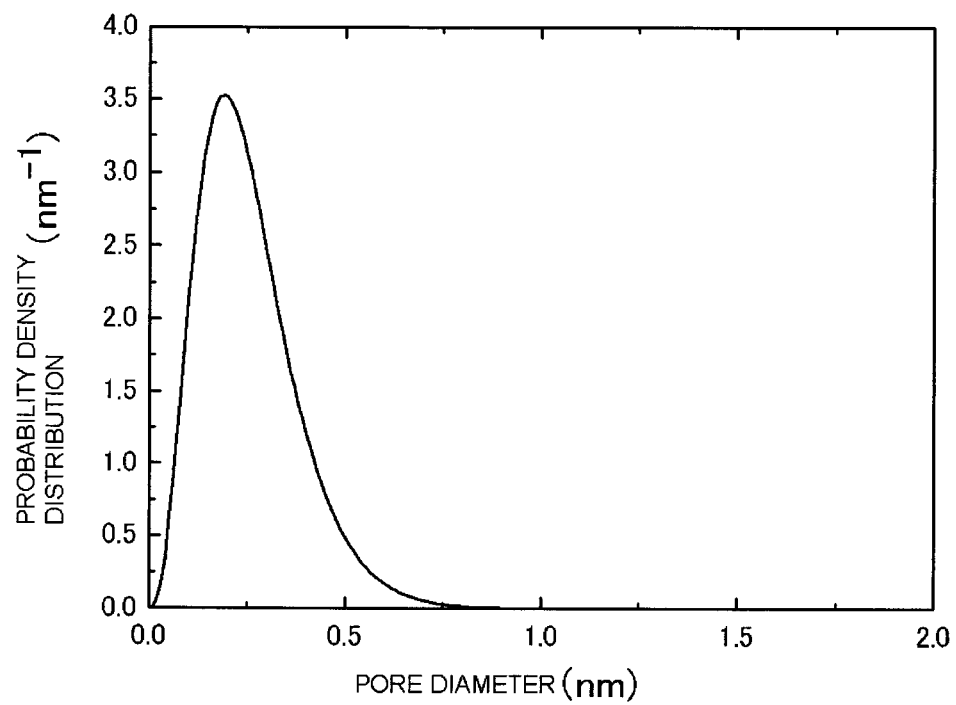
FIG. 7 is a graph illustrating an example.

Next, when the pore diameters of the first insulating film 102 and the second insulating film 103 were examined by a small-angle X-ray scattering apparatus, a result shown in FIG. 7 was obtained. The average pore diameter was 0.25 nm, the half-value width was 0.4 nm, and the maximum pore diameter was 1.0 nm.

Moreover, in Example 1, when the first insulating film 102 and the second insulating film 103 were observed by a transmission electron microscope (TEM), the shades of images thereof were confirmed. As a result, it was observed that the first insulating film 102 had a relatively light image and the second insulating film 103 had a relatively dark image as the image gradually became darker from the interface between the first insulating film 102 and the second insulating film 103. This showed that the electron density of the first insulating film 102 was lower than the electron density of the second insulating film 103. It is commonly known that correlation exists in the electron density and the relative dielectric constant. However, for the purpose of confirmation, when the first insulating film 102 and the second insulating film 103 were respectively formed on the silicon substrate independently, and the relative dielectric constant was measured by a mercury probe, the relative dielectric constant of the first insulating film 102 was lower than that of the second insulating film 103. The relative dielectric constant of the first insulating film 102 was 2.5, and the relative dielectric constant of the second insulating film 103 was 2.55.

In addition, when C/Si, O/Si, and C/O (atom ratio) of each insulating film were measured by X-ray photoelectron spectroscopy (XPS) measurement, C/O of the first insulating film 102 was higher than C/O of the second insulating film 103. In addition, C/Si of the first insulating film 102 was 2.7, and C/Si of the second insulating film 103 was 2.7. In addition, O/Si of the first insulating film 102 was 0.7, and O/Si of the second insulating film 103 was 0.8.

Comparative Example 1

Figure 6B:
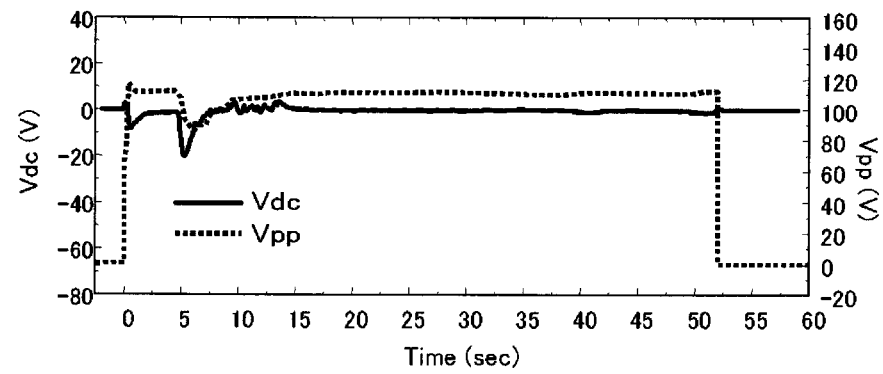
FIG. 6B is a diagram illustrating a comparative example.

The insulating film 902 was formed on the underlying film 901 according to the timing diagram of FIG. 12B using the configuration shown in FIG. 12A. As the plasma generation apparatus, an apparatus shown in FIG. 2 was used. The pressure within the chamber was maintained to 300 Pa. A silicon substrate was used as the underlying film 901. Trivinyltriisopropylcyclotrisiloxane represented by the above-mentioned Formula (11) was used as the cyclic siloxane, and He gas was used as the carrier gas. The deposition rate of the insulating film 902 was set to 120 nm/minute. In the in-plane distribution measurement of film thickness uniformity (the apparatus was the same as that of Example 1) ten seconds after the start of film deposition, the in-plane uniformity of film thickness was 15%, and the in-plane uniformity of film thickness at a point of time of forming a film thickness of 100 nm was 6.5%. When temporal changes in the high-frequency voltage amplitude Vpp and the self-bias Vdc were examined, the abnormal electrical discharge was confirmed at twenty seconds after the start of film deposition, as shown in FIG. 6B.

Example 2

In the method of Example 1, whether the abnormal electrical discharge had arisen or not was examined by changing the thicknesses of the first insulating film 102 to be formed at 0, 3, 7, 8, 10, and 15 nm, respectively. The result is shown in Table 1.

TABLE 1

| Thickness of First Insulating Film | Had Abnormal Electrical Discharge Arisen? |
| --- | --- |
| 0 nm | Yes |
| 3 nm | Yes |
| 7 nm | Yes |
| 8 nm | Yes |
| 10 nm | No |
| 15 nm | No |

When the first insulating film 102 was formed at less than 10 nm, the abnormal electrical discharge was confirmed in the initial stage of formation of the second insulating film 103. On the other hand, when the first insulating film 102 was formed to have a thickness of 10 nm and 15 nm, the abnormal electrical discharge was not confirmed throughout forming the first and second insulating films 102 and 103.

Example 3

An antenna test element group (TEG) wafer was used in which a gate electrode having a pad was created on a MOS capacitor in order to measure plasma damage at the time of formation. An antenna ratio is defined as a ratio of the gate electrode area to the gate area. The wafer size is 300 mm, and the thickness of the gate insulating film is 2 nm. The first and second insulating films 102 and 103 were sequentially formed according to the timing diagram of FIG. 3 using this TEG wafer as the underlying film 101 of FIGS. 1A to 1C. Trivinyltriisopropylcyclotrisiloxane represented by the above-mentioned Formula (11) was used as the cyclic siloxane, and a helium gas was used as the carrier gas. In I region of FIG. 3, the RF power was controlled so as to have a film deposition rate of 90 nm/minute, and the first insulating film 102 having a thickness of 10 nm was formed. Thereafter, the film deposition rate was set to 120 nm/minute for ten seconds, and the second insulating film 103 having a thickness of 190 nm was formed.

Comparative Example 2

By using the same antenna TEG wafer as that of Example 3, the insulating film 902 was formed according to the timing diagram shown in FIG. 12B using the TEG wafer as the underlying film 901 of FIG. 12A. As the plasma generation apparatus, an apparatus shown in FIG. 2 was used. Trivinyltriisopropylcyclotrisiloxane represented by the above-mentioned Formula (11) was used as the cyclic siloxane, and helium gas was used as the carrier gas. The deposition rate of the insulating film 902 was set to 120 nm/minute, and the insulating film 902 having a thickness of 200 nm was formed.

Dielectric Strength Voltage Test

The dielectric strength voltage test of the antenna TEG was performed using an auto prober. While a voltage was applied to the gate oxide film, a leak current was monitored, and a point of time of exceeding the specified amount of the current was determined to be a breakdown. An element for which the electric field intensity at a point of time of exceeding the specified amount of the current was equal to or more than 14 MV/cm was determined to be of a good quality, and an element for which the electric field intensity was less than 14 MV/cm was determined to be of a poor quality. The percentage of the good quality to the entire element of the antenna TEG wafer was set as a good quality rate.

Evaluation 1

Figure 8A:
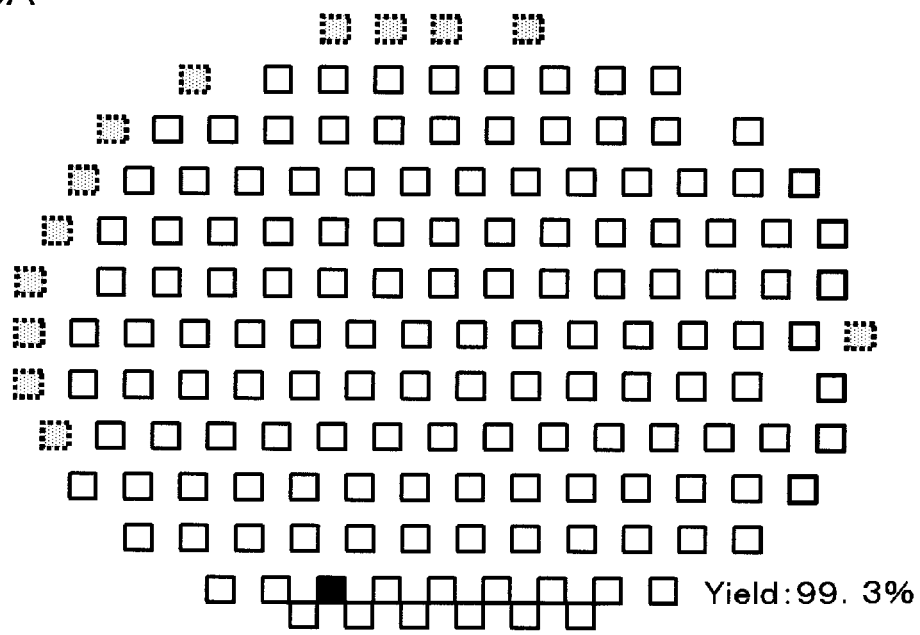
FIG. 8A is a diagram illustrating an example.
Figure 8B:
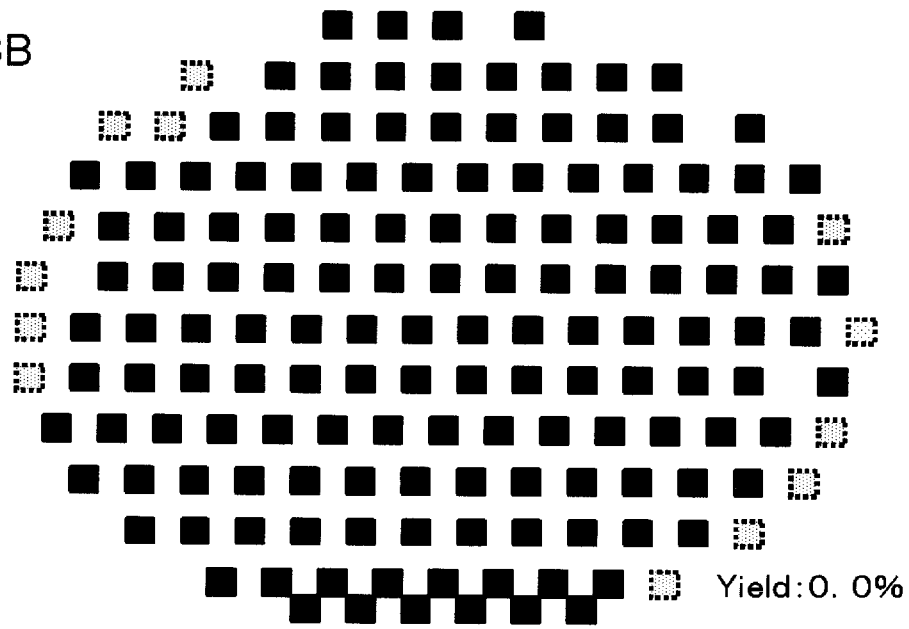
FIG. 8B is a diagram illustrating a comparative example.

The result of the dielectric strength voltage test of Example 3 and Comparative example 2 is shown in FIGS. 8A and 8B. The result of Example 3 is FIG. 8A, and the good quality rate was 99%. On the other hand, the result of Comparative example 2 is FIG. 8B, and the good quality rate was 0%.

Evaluation 2

Figure 9:
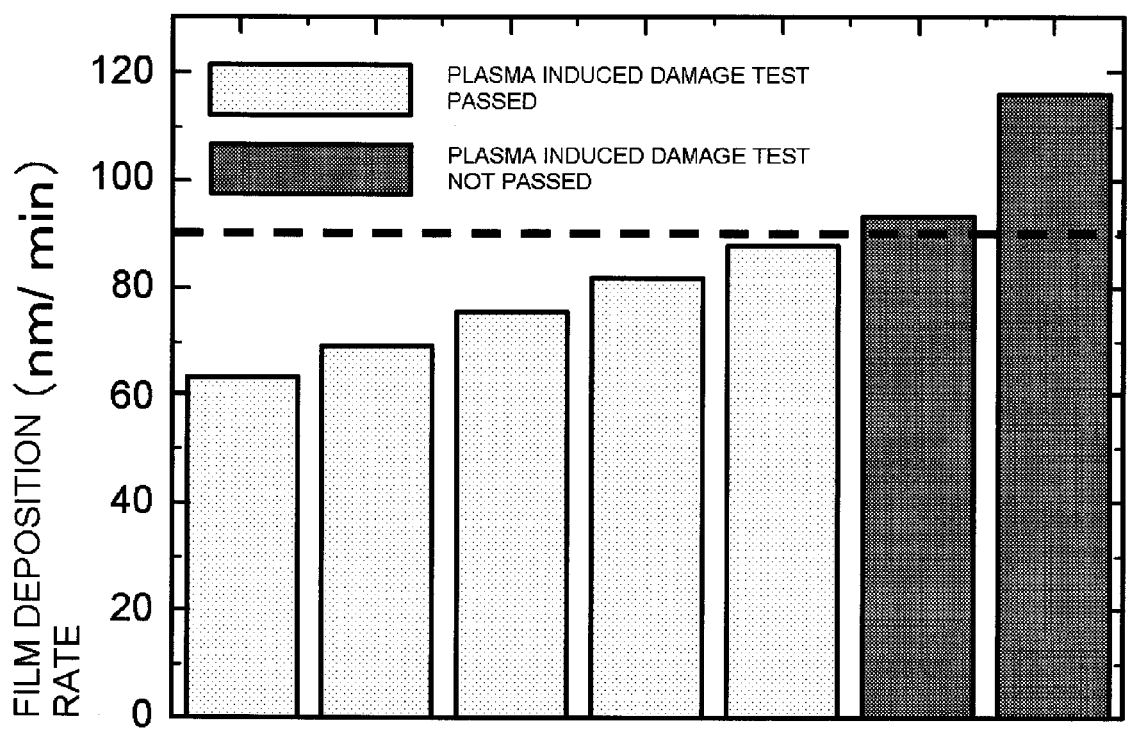
FIG. 9 is a graph illustrating an example.

In Example 3, the dielectric strength voltage test was performed on each of the TEG wafers by changing the deposition rate of the first insulating film 102. The result is shown in FIG. 9. The wafer having a good quality rate of equal to or more than 50% was set as an allowable range of plasma damage (plasma damage OK) to the gate insulating film, and the wafer having a good quality rate of less than 50% was set as existence of plasma damage (plasma damage NG) in the gate insulating film. As a result, the deposition rate of the first insulating film 102 was set to be equal to or less than 90 nm/minute, so that plasma damage to the gate insulating film was set to an allowable range.

Example 4

Figure 10A:
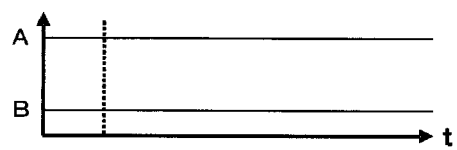
FIG. 10A is a timing diagram of a comparative example.
Figure 10C:
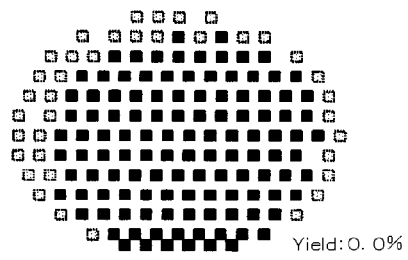
FIG. 10C is a diagram illustrating a comparative example.
Figure 10B:
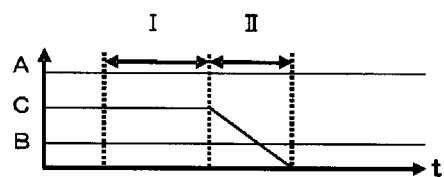
FIG. 10B is a timing diagram of an example.
Figure 10D:
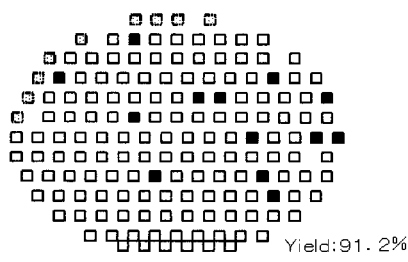
FIG. 10D is a diagram illustrating an example.

By using the same TEG wafer as that of Example 3, the first insulating film 102 and the second insulating film 103 were formed according to the timing diagram of FIG. 10B using the TEG wafer as the underlying film 101 of FIGS. 1A to 1C. As the plasma generation apparatus, an apparatus shown in FIG. 2 was used. The pressure within the chamber was maintained at 300 Pa, and the RF power was set to 300 W. Trivinyltriisopropylcyclotrisiloxane represented by the above-mentioned Formula (11) was used as the cyclic siloxane, and He gas was used as the excitation gas and the carrier gas. In FIGS. 10A to 10D, A denotes the cyclic siloxane gas, B denotes the carrier gas, and C denotes the excitation gas. The flow rate of B was 300 sccm, and the flow rate of C was 700 sccm. The formation time (I) of the first insulating film 102 was set to ten seconds, and the flow rate of C was set to 0 sccm for seven seconds (period of II). Thereby, the ratio $(a_1/(b_1+c_1))$ of the flow rate $(a_1)$ of the cyclic siloxane gas to the sum $(b_1)$ of the flow rate of the carrier gas and the flow rate $(c_1)$ of the excitation gas at forming the first insulating film 102 was set to 0.1, and the ratio $(a_2/(b_2+c_2))$ of the flow rate $(a_2)$ of the cyclic siloxane gas to the sum $(b_2+c_2)$ of the flow rate $(b_2)$ of the carrier gas and the flow rate $(c_2)$ of the excitation gas at forming the second insulating film 102 was set to 0.3. In this manner, the deposition rate of the first insulating film 102 was made slower than the deposition rate of the second insulating film 103.

Comparative Example 3

By using the same TEG wafer as that of Example 3, the insulating film 902 was formed according to the timing diagram shown in FIG. 10A using the TEG wafer as the underlying film 901 shown in FIG. 12A. The Comparative example is the same as Example 3 except that the flow rate of C was set to 0 sccm from the beginning. Thereby, the ratio (a/b) of the flow rate (a) of the cyclic siloxane gas to the flow rate (b) of the carrier gas was set to 0.3, and the deposition rate of the first insulating film 102 and the deposition rate of the second insulating film 103 were set to be identical to each other.

Evaluation 3

The dielectric strength voltage test was performed on each of the TEG wafers of Example 4 and Comparative example 3. The result is shown in FIGS. 10A to 10D. The result of Example 4 is FIG. 10D. The good quality rate was 91%, and the relative dielectric constant of the entirety of the first insulating film 102 and the second insulating film 103 was 2.7. The result of Comparative example 3 is FIG. 10C. The good quality rate was 0%, and the relative dielectric constant of the insulating film 902 was 2.55.

Evaluation 4

Figure 11:
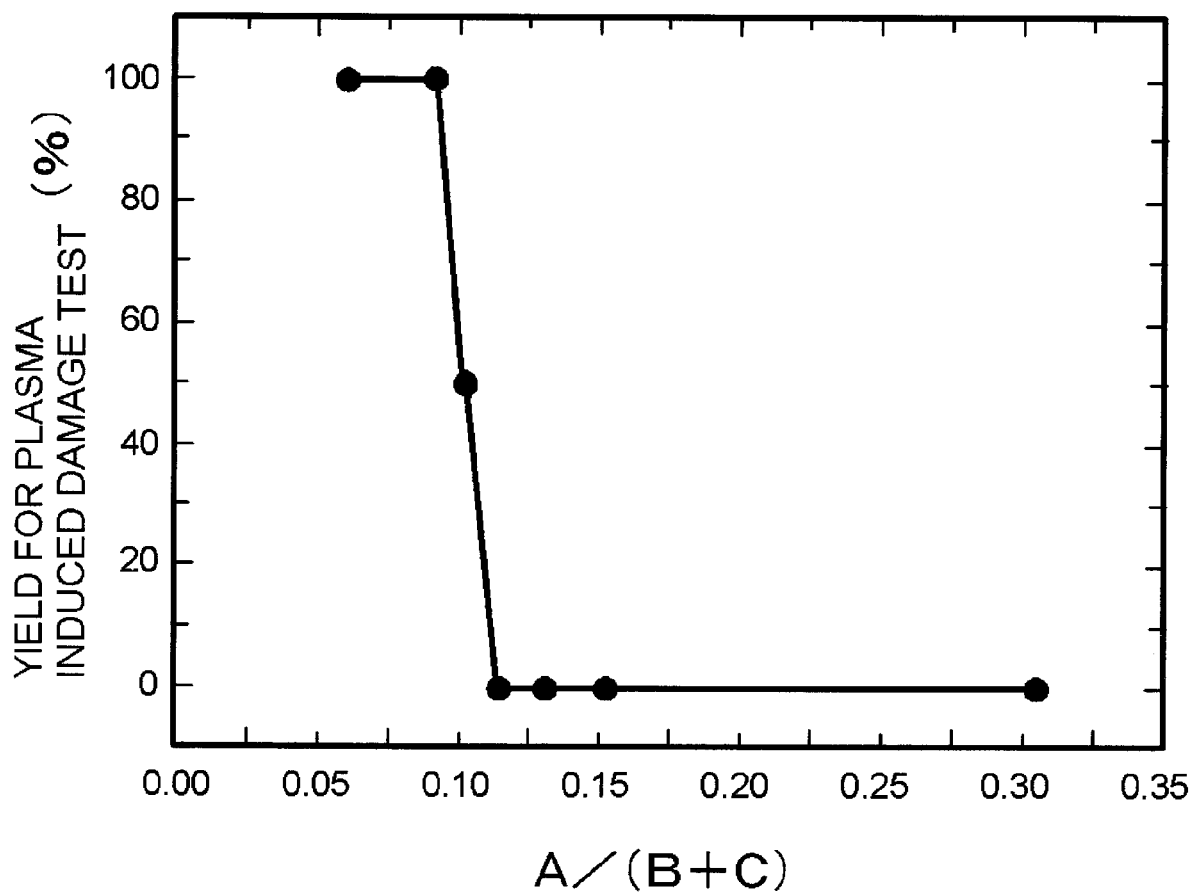
FIG. 11 is a graph illustrating an example.

In the method of Example 4, $(a_1/(b_1+c_1))$ and $(a_2/(b_2+c_2))$ were set to be constant, and the ratios thereof were changed in a range of 0.05 to 0.3. The dielectric strength voltage test was performed on each of the TEG wafers. The result is shown in FIG. 11. The horizontal axis of FIG. 11 denotes the ratio of the flow rate of the cyclic siloxane gas (A) to the sum of the flow rate of the excitation gas (B) and the flow rate of the carrier gas (C). When $(a_1/(b_1+c_1))$ and $(a_2/(b_2+c_2))$ were set to be larger than 0.10, the deposition rate of the first insulating film 102 and the deposition rate of the second insulating film 103 were made identical to each other, and the good quality rate was 0%.

The first insulating film 102 and the second insulating film 103, which were formed in Examples 3 and 4, were observed by a transmission electron microscope (TEM). In Example 3, the image of the first insulating film 102 was relatively light, and the image of the upper portion of the second insulating film 103 became darker than the image of the first insulating film 102 as the image gradually became darker from the interface between the first insulating film 102 and the second insulating film 103. For this reason, it is predicted that the first insulating film 102 has a lower relative dielectric constant than that of the second insulating film 103. Moreover, in Example 4, the image of the first insulating film 102 was relatively dark, and the image of the upper portion of the second insulating film 103 became darker than the first insulating film 102 as the image gradually became lighter from the interface between the first insulating film 102 and the second insulating film 103. For this reason, it is predicted that the first insulating film 102 has a higher relative dielectric constant than that of the second insulating film 103.

Meanwhile, since the test in which the antenna TEG wafer is used is an acceleration test, it is considered that the result of the good quality rate of the dielectric strength voltage test of the normal device is larger than the result of the good quality rate of the dielectric strength voltage test in which the TEG wafer was used.

Example 5

By using the configuration of FIGS. 1A to 1C, the first insulating film 102 and the second insulating film 103 were formed according to the timing diagram shown in FIG. 14. As the plasma generation apparatus, an apparatus shown in FIG. 2 was used. In the example, a silicon substrate was used as the underlying film 101 in order to more simply perform the measurement of the film thickness uniformity. Trivinyltriisopropylcyclotrisiloxane represented by the above-mentioned Formula (11) was used as the cyclic siloxane, and helium gas was used as the carrier gas and the excitation gas. $N_2O$ gas was used in an oxidized gas, and the pressure within the chamber was maintained to 250 Pa. At the time of forming the first insulating film 102, the carrier gas was set to 300 sccm, the excitation gas was set to 700 sccm, and the $N_2O$ gas was set to 80 sccm. Moreover, at the time of forming the second insulating film 103, the carrier gas was set to 300 sccm, the excitation gas was set to 200 sccm, and the $N_2O$ gas was set to 80 sccm.

Figure 16:
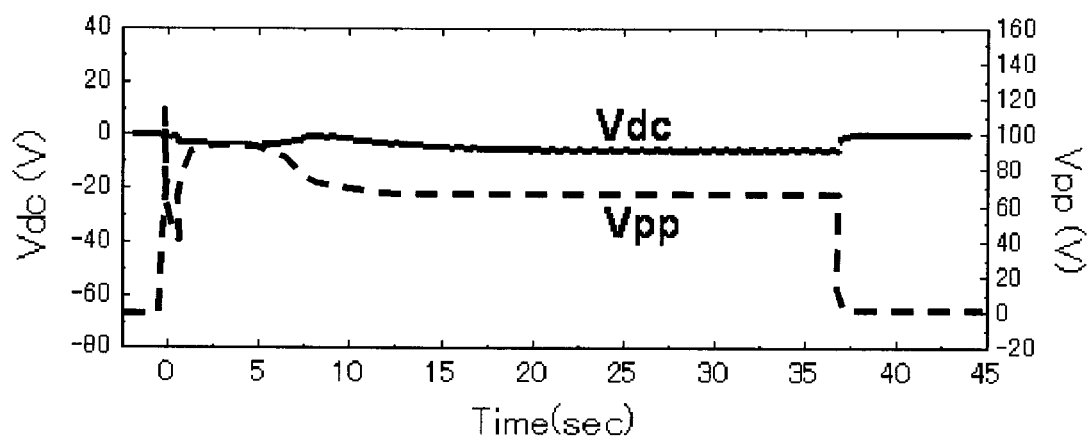
FIG. 16 is a diagram illustrating an example.
Figure 23:
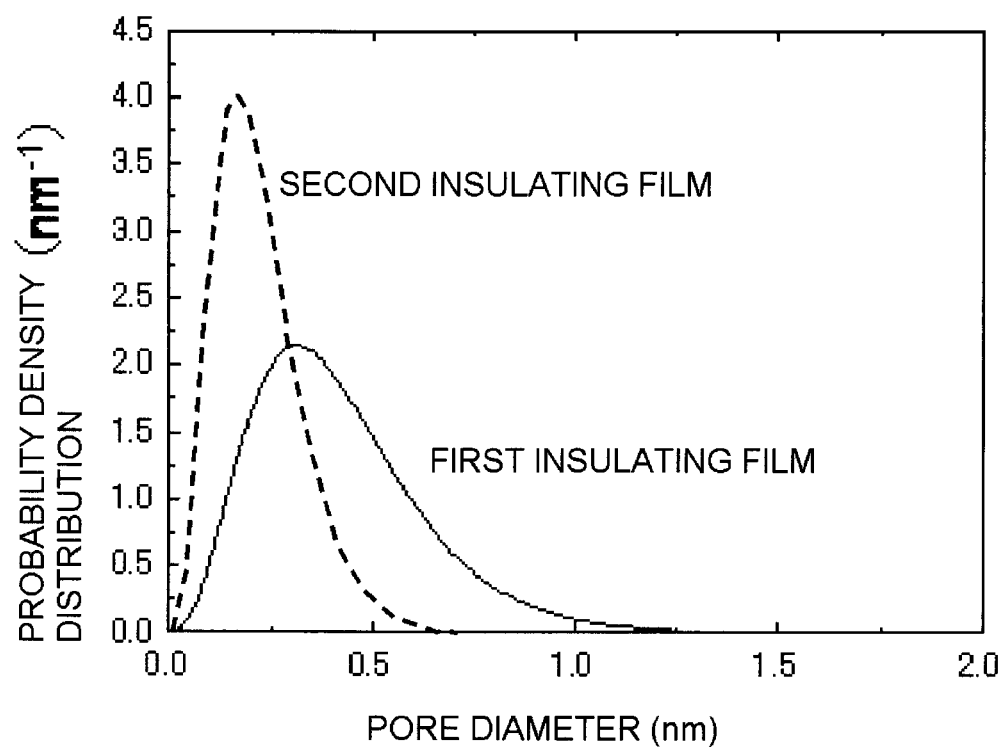
FIG. 23 is a graph illustrating an example.

When the first insulating film 102 was formed to have a thickness of 10 nm, and the in-plane distribution measurement of film thickness was performed using a spectroscopic ellipsometer, the in-plane uniformity of thickness of the first insulating film 102 was 5%. Thereafter, while the flow rate of the excitation gas is reduced, formation of the second insulating film 103 was started. The flow rate of the excitation gas may be lower than that in the time of forming the first insulating film 102, and may also be reduced to zero. The film deposition rate in I region of FIG. 14 is 0.9 times the film deposition rate in II region of FIG. 14. The first insulating film 102 was configured such that the relative dielectric constant was 2.6, the maximum pore diameter was 1.5 nm, and the film composition obtained by the X-ray photoelectron spectroscopy (XPS) measurement had a C/Si ratio (atom ratio) of 2.3 and an O/Si ratio (atom ratio) of 0.7. On the other hand, the second insulating film was configured such that the relative dielectric constant was 2.55, the maximum pore diameter was 0.83 nm, and the film composition had a C/Si ratio of 2.5 and an O/Si ratio of 0.6. The pore distribution is shown in FIG. 23. When the second insulating film 102 having a thickness of 100 nm was formed, and the in-plane distribution of the film thickness uniformity was measured, the in-plane uniformity of film thickness was 4%. When temporal changes in the high-frequency voltage amplitude Vpp and the self-bias Vdc were examined, the abnormal electrical discharge was confirmed as shown in FIG. 16. In addition, the good quality rate of the antenna TEG wafer was 90%, and the same good quality rate as that in a process of adding no oxidized gas was obtained even in a process of adding an oxidized gas. In addition, before the first insulating film 102 was formed on the antenna TEG wafer, as shown in the fourth embodiment, the good quality rate was 90% without any change as a result of performing helium plasma processing and evaluating the influence thereof.

Figure 17:
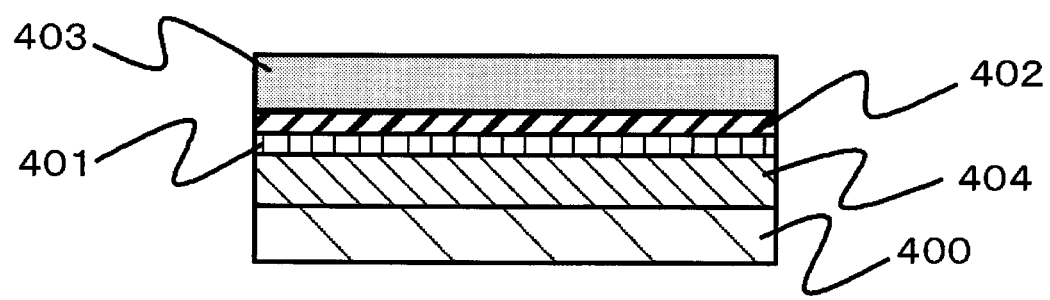
FIG. 17 is a diagram illustrating an example.

Next, evaluation of adhesion to the underlying film 101 was performed. A laminated structure shown in FIG. 17 (400: silicon substrate, 401: SiCN film (barrier insulating film), 402: first insulating film, 403: second insulating film, 404: oxide film) was created, and the adhesion strength was measured by a modified edge liftoff test (m-ELT). Before the first insulating film 402 was formed, the surface of the SiCN film 401 was processed by helium plasma. An epoxy resin was applied at 20 to 200 microns on a structure of FIG. 17, and it was cut to about 1 cm square. This sample was cooled by liquid nitrogen and the detaching temperature was measured. When cooling starts, detaching was generated in a portion having weakest adhesion by thermal stress due to the difference of the amount of thermal contraction between the structure of FIG. 17 and the epoxy applied thereon. In this case, it is possible to obtain the adhesion strength by the thickness of the applied epoxy resin, the coefficient on thermal contraction, and the detaching start temperature.

Example 6

By using the configuration of FIGS. 1A to 1C, the first insulating film 102 and the second insulating film 103 were formed according to the timing diagram shown in FIG. 4. As the plasma generation apparatus, an apparatus shown in FIG. 2 was used.

The ratio (C/Si) of the number of carbon atoms (C) to the number of silicon atoms (Si) in the first insulating film 102 formed in this manner was lower than C/Si in the second insulating film 103. This is because the cyclic siloxane collides with the carrier gas to thereby be easily dissociated, and thus the valence of Si increases, that is, oxidation proceeds. Therefore, the first insulating film 102 became more rigid than the second insulating film 103. For this reason, adhesion to the underlying film 101 was improved. In addition, the oxygen/silicon ratio (O/Si) of the first insulating film 102 became higher than O/Si of the second insulating film 103. Therefore, the first insulating film 102 was superior to the second insulating film 103 in film strength. In addition, the C/O ratio of the first insulating film 102 was lower than the C/O ratio of the second insulating film 103. At the time of forming the first insulating film 102, the carrier gas was set to 300 sccm, the excitation gas was set to 700 sccm, and the organosiloxane gas flow rate was set to 30 to 150 sccm. In addition, at the time of forming the second insulating film 103, the carrier gas was set to 300 sccm, the excitation gas was set to 0 sccm, and the organosiloxane gas flow rate was set to 60 to 130 sccm, whereby the film composition was analyzed using XPS. As a result, the C/O ratio of the first insulating film 102 was equal to or more than 3.14 and equal to or less than 3.29, and the C/O ratio of the second insulating film 103 was equal to or more than 3.38 and equal to or less than 4.17.

Example 7

Figure 21:
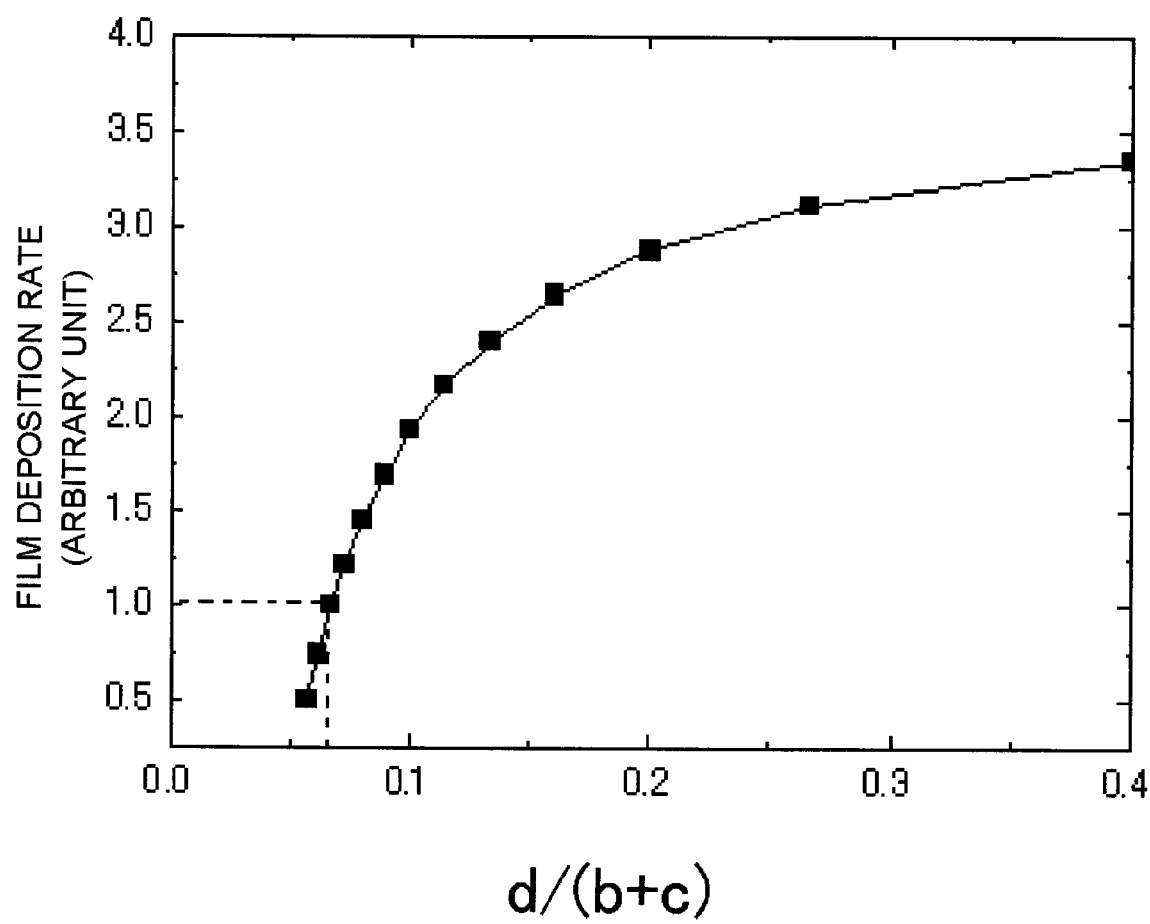
FIG. 21 is a graph illustrating an example.
Figure 22:
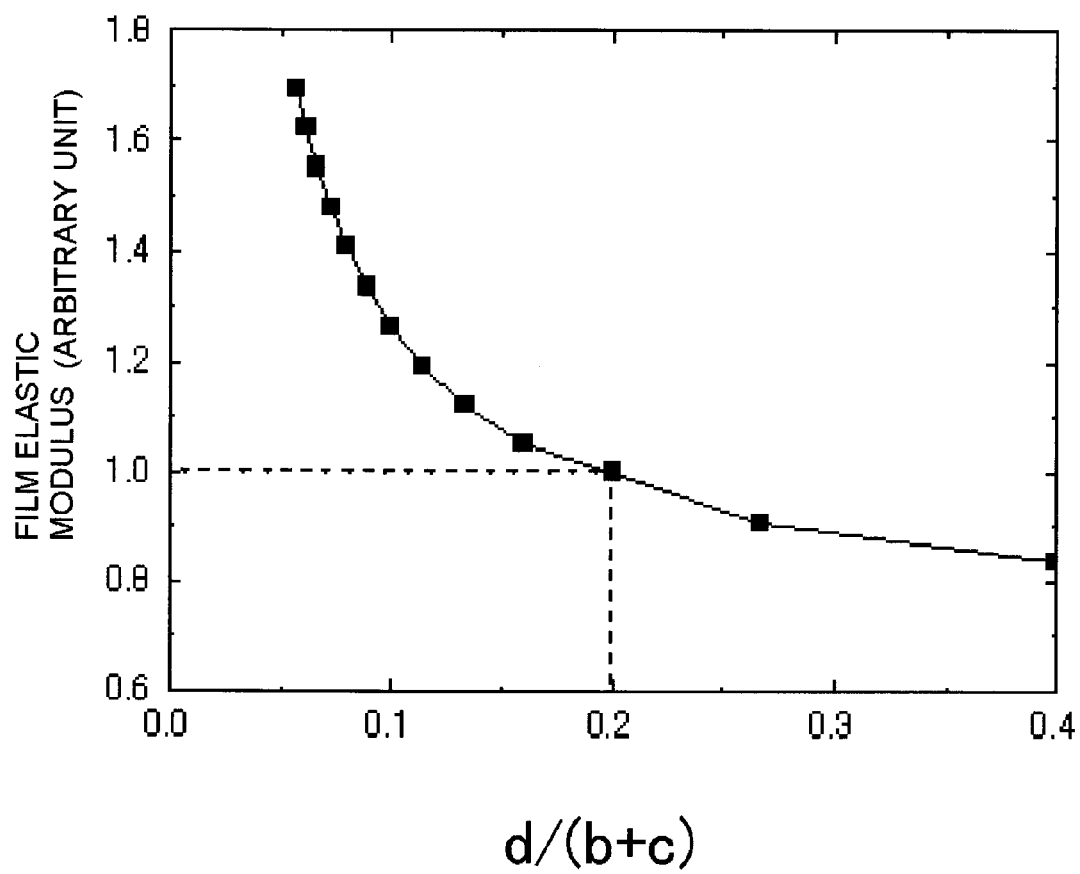
FIG. 22 is a graph illustrating an example.

By using the configuration of FIGS. 1A to 1C, the first insulating film 102 and the second insulating film 103 were formed according to the timing diagram shown in FIG. 14. As the plasma generation apparatus, an apparatus shown in FIG. 2 was used. In the example, the relationship to the film deposition rate and the film strength was examined using any of oxygen ($O_2$), carbon dioxide ($CO_2$), nitrogen monoxide ($N_2O$) and nitrogen dioxide ($NO_2$) as the oxidized gas. FIGS. 21 and 22 show all the results obtained using these oxidized gases, and show the relationships between the ratio (d/(b+c)) of the flow rate (d) of the oxidized gas to the sum (b+c) of the flow rate (b) of the carrier gas and the flow rate (c) of the excitation gas, and the film deposition rate and the film strength.

From the viewpoint of the film deposition rate at the time of forming the first insulating film 102, the d/(b+c) ratio is preferably set to be equal to or more than 0.01; more preferably equal to or more than 0.06. Moreover, from the viewpoint of film strength, the d/(b+c) ratio is preferably set to be equal to or less than 0.3, more preferably equal to or less than 0.2.

That is, when the first insulating film 102 is formed in the period of I of the timing diagram shown in FIG. 14, the ratio ($d_1/(b_1+c_1)$) of the flow rate ($d_1$) of the oxidized gas to the sum ($b_1+c_1$) of the flow rate ($b_1$) of the carrier gas and the flow rate ($c_1$) of the excitation gas which are introduced into the chamber 201 is preferably set to be equal to or more than 0.01 and equal to or less than 0.3, more preferably equal to or more than 0.06 and equal to or less than 0.2.

Moreover, in forming the second insulating film 103 (II), the mixing ratio ($a_2/(b_2+c_2)$) of the gas flow rate ($a_2$) of the cyclic siloxane to the sum ($b_2+c_2$) of the flow rate ($b_2$) of the carrier gas and the flow rate ($c_2$) of the excitation gas may be set to be equal to or more than 0.2. For example, the flow rate of the excitation gas is set to zero by gradually reducing the flow rate of the excitation gas for a predetermined period of time after starting to form the second insulating film 103. In this manner, the mixing ratio ($a_2/(b_2+c_2)$) of the gas flow rate ($a_2$) of the cyclic siloxane to be supplied to the sum ($b_2+c_2$) of the flow rate of the excitation gas and the flow rate of the carrier gas can be set to be equal to or more than 0.2.

In addition, when the second insulating film 103 is formed in II region of the timing diagram shown in FIG. 14, the ratio (d/(b+c)) of the flow rate (d) of the oxidized gas to the sum (b+c) of the carrier gas flow rate (b) and the excitation gas flow rate (c) which are introduced into the chamber 201 may be set to be equal to or more than 0.1 and equal to or less than 0.4. Since the second insulating film 103 is thicker than the first insulating film 102, it is preferable to raise the film deposition rate in this period in order to shorten the film deposition time. It is estimated that the second insulating film 103 is required to have a film deposition rate at least two times or more than that of the first insulating film 102.

From FIG. 21, the ratio (d/(b+c)) of the flow rate (d) of the oxidized gas to the sum (b+c) of the flow rate (b) of the carrier gas and the flow rate (c) of the excitation gas is preferably set to be equal to or more than 0.1. In addition, when the carrier gas is reduced, there may be a case where raw material vaporization becomes unstable. Therefore, the ratio (d/(b+c)) of the flow rate (d) of the oxidized gas to the sum (b+c) of the flow rate (b) of the carrier gas and the flow rate (c) of the excitation gas can be set to be equal to or less than 0.4. In this manner, the characteristics of good vaporization can be obtained.

Example 8

By using the configuration of FIGS. 1A to 1C, the first insulating film 102 and the second insulating film 103 were formed according to the timing diagram shown in FIG. 3. As the plasma generation apparatus, an apparatus shown in FIG. 2 was used.

In addition, the ratio (C/O) of the number of carbon atoms (C) to the number of oxygen atoms (O) in the first insulating film 102 became higher than that in the second insulating film 103. At the time of forming the first insulating film 102, the carrier gas was set to 300 sccm, the pressure was set to 200 Pa, the organosiloxane gas flow rate was set to 90 sccm, and the RF output was set to 175 W. Moreover, at the time of forming the second insulating film 103, the carrier gas was set to 300 sccm, the pressure was set to 200 Pa, the organosiloxane gas flow rate was set to 90 sccm, and the RF output was set to 275 W, whereby the film composition was analyzed using XPS. As a result, the C/O ratio in the first insulating film 102 was 3.86, and the C/0 ratio in the second insulating film 103 was 3.38.

Comparative Example 4

Figure 18:
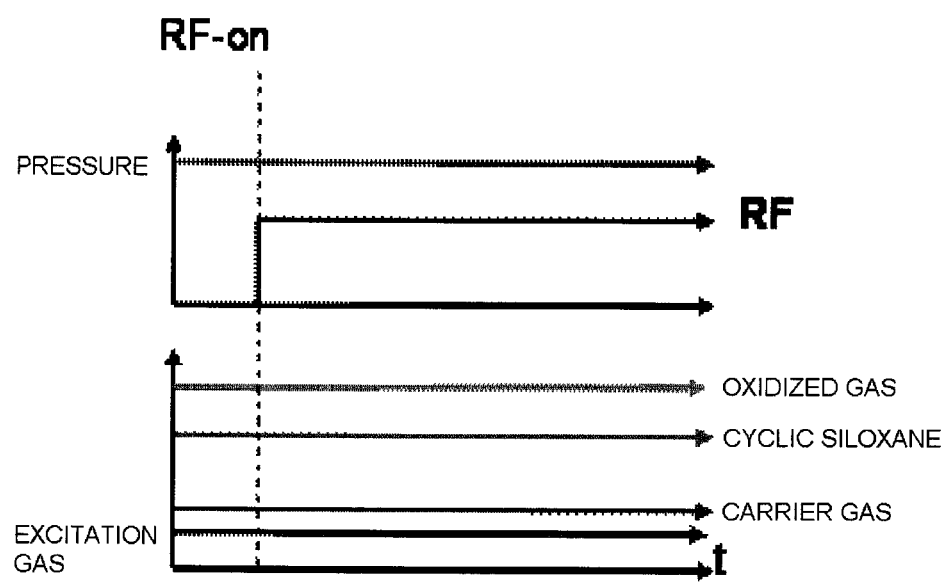
FIG. 18 is a timing diagram of a comparative example.
Figure 19:
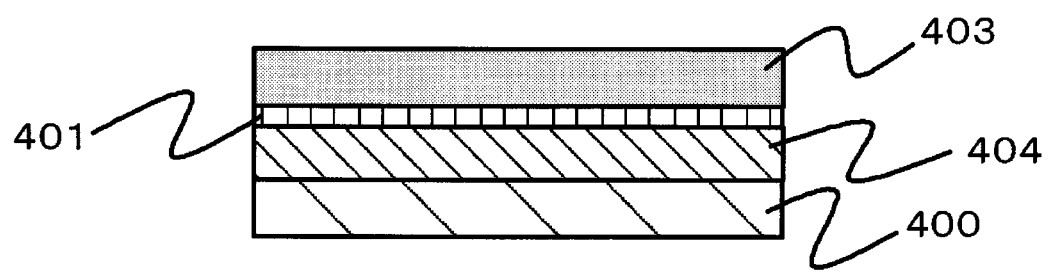
FIG. 19 is a diagram illustrating a comparative example.

The laminated structure shown in FIG. 19 was created according to the timing diagram shown in FIG. 18, and similarly, the adhesion strength was measured by the m-ELT. In the laminated structure of FIG. 19, only the point that the first insulating film 402 is not formed is different from the laminated structure of FIG. 17. The timing diagram of FIG. 18 is the same as the portion where the excitation gas in the region of II shown in FIG. 14 is reduced and then is stabilized.

Figure 20:
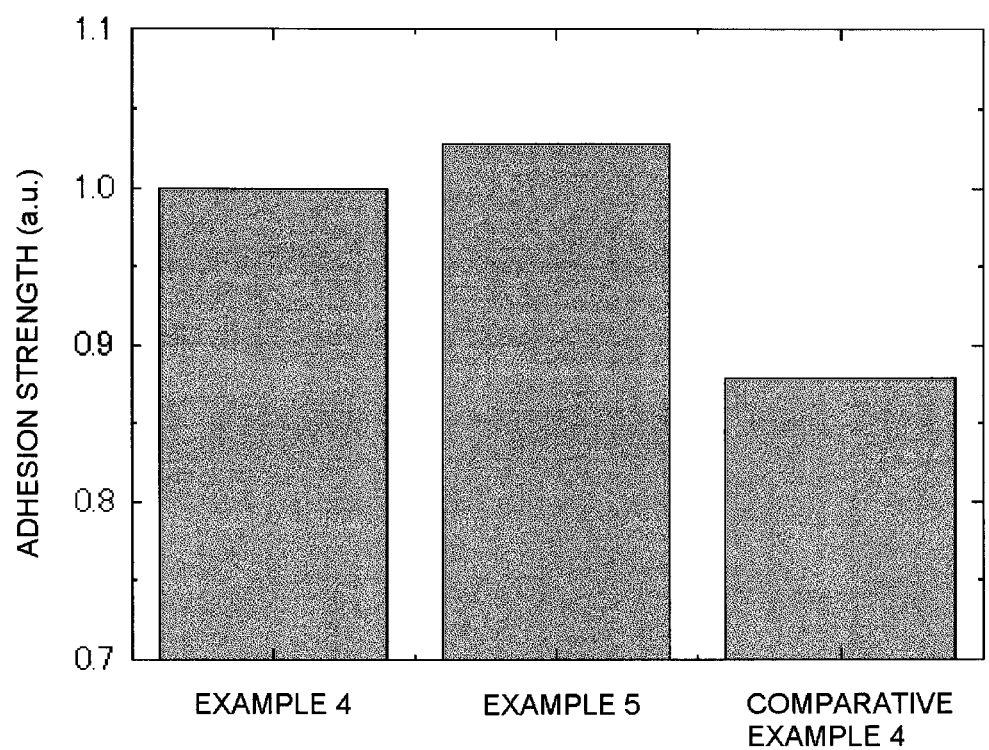
FIG. 20 is a graph illustrating adhesion strength.

The adhesion of the films of Examples 4 and 5 formed using the timing diagram of FIG. 4 similarly to Comparative example 4 was also tested. The result is shown in FIG. 20. It was concluded that the adhesion strength in the case where the formation was performed according to the timing diagrams shown in Examples 4 and 5 was higher than that in the case where the formation was performed without changing the conditions like Comparative example 4. In addition, Example 5 in which helium plasma processing was performed showed a slightly higher adhesion strength than Example 4.

(Further Embodiment 1)

A semiconductor device comprising:

metal interconnections; and an insulating interlayer, having a laminated structure, made of a first insulating film and a second insulating film, wherein said insulating interlayer is formed between said metal interconnections;

said first insulating film is formed on an underlying film by plasma polymerization of organosiloxane having a Si—O cyclic structure;

said second insulating film is formed on said first insulating film by plasma polymerization of said organosiloxane continuously after forming the first insulating film, and the deposition rate of said first insulating film is slower than the deposition rate of said second insulating film.

(Further Embodiment 2)

A semiconductor device comprising:

an underlying film;

a first insulating film formed on said underlying film; and a second insulating film continuously formed over said first insulating film, wherein at least one of said first and second insulating films has cyclic siloxane, and both of said first and second insulating film include silicon, oxygen, carbon and hydrogen as constituent elements, and when the ratio of the number of carbon atoms (C) to the number of oxygen atoms (O) contained in said first and second insulating film is set as the C/O ratio, the C/O ratios of said first insulating film and said second insulating film are different from each other.

(Further Embodiment 3)

The semiconductor device according to Supplement 2, wherein the thickness of said first insulating film is equal to or more than 10 nm.

(Further Embodiment 4)

The semiconductor device according to Supplement 2, wherein the relative dielectric constants of said first insulating film and said second insulating film are different from each other, and both of said relative dielectric constants are equal to or less than 2.7.

(Further Embodiment 5)

The semiconductor device according to Supplement 2, wherein the maximum diameter of a pore formed in said first and second insulating films is equal to or less than 1.5 nm.

(Further Embodiment 6)

The semiconductor device according to Supplement 2, wherein the C/O ratio of said first insulating film is lower than the C/O ratio of said second insulating film.

(Further Embodiment 7)

The semiconductor device according to Supplement 6, wherein the C/O ratio of said first insulating film is in a range of equal to or more than 3.14 and equal to or less than 3.29, and the C/O ratio of said second insulating film is in a range of equal to or more than 3.38 and equal to or less than 4.17.

(Further Embodiment 8)

The semiconductor device according to Supplement 2, wherein the C/O ratio of said first insulating film is higher than the C/O ratio of said second insulating film.

(Further Embodiment 9)

The semiconductor device according to Supplement 8, wherein the C/O ratio of said first insulating film is 3.86, and the C/O ratio of said second insulating film is 3.38.

(Further Embodiment 10)

The semiconductor device according to Supplement 2, wherein said underlying film includes at least silicon and carbon as constituent elements, and when the ratio of the number of carbon atoms (C) to the number of silicon atoms (Si) contained in said underlying film is set as the C/Si ratio, the C/Si ratio of said underlying film in the interface between said underlying film and said first insulating film is lower than the C/Si ratio inside of said underlying film.

(Further Embodiment 11)

The semiconductor device according to Supplement 10, wherein the C/Si ratio of said underlying film in the interface between said underlying film and said first insulating film is equal to or more than 0.5 and equal to or less than 1.4.

(Further Embodiment 12)

The semiconductor device according to Supplement 1 or 2, wherein the semiconductor device has a multilayered interconnection structure including a laminated structure, in which said second insulating film is laminated on said first insulating film, as an insulating interlayer.

(Further Embodiment 13)

The semiconductor device according to Supplement 1 or 2, wherein the semiconductor device has a laminated structure, including an interconnection layer and a via layer, in which said second insulating film is laminated on said first insulating film, in at least one of said interconnection layer and said via layer.

It is apparent that the present invention is not limited to the above embodiment, and may be modified and changed without departing from the scope and spirit of the invention.

What is claimed is:

1. A method of manufacturing a semiconductor device, comprising:

forming a first insulating film on an underlying film by plasma polymerization of organosiloxane having a Si—O cyclic structure; and forming a second insulating film on said first insulating film by plasma polymerization of said organosiloxane continuously after forming the first insulating film,
wherein the deposition rate of said first insulating film is slower than the deposition rate of said second insulating film, and
wherein an excitation gas flow rate in said step of forming the first insulating film is decreased in said step of forming the second insulating film, thereby to cause the deposition rate of said second insulating film to be made faster than the deposition rate of said first insulating film.

2. The method of manufacturing a semiconductor device as set forth in claim 1, wherein said organosiloxane is organosiloxane represented by Formula (1) below:

[Formula 1]

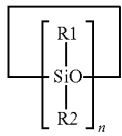

(1)

in Formula (1), n is 2 to 5, and R1 and R2 are any of a vinyl group, an allyl group, a methyl group, an ethyl group, a propyl group, an isopropyl group and a butyl group, where R1 and R2 may be the same, or different from each other.

3. The method of manufacturing a semiconductor device as set forth in claim 1, wherein said organosiloxane has a linear unsaturated hydrocarbon group of a carbon number of 2 to 4 or a branched-chain saturated hydrocarbon group of a carbon number of 3 to 4, where said linear unsaturated hydrocarbon group or said branched saturated hydrocarbon group is bound to a Si atom forming said Si—0 cyclic structure.

4. The method of manufacturing a semiconductor device as set forth in claim 1, wherein said organosiloxane is cyclic organosiloxane represented by any of Formulae (2) to (9) below:

[Formula 2]

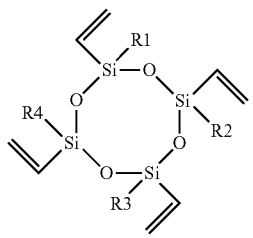

(2)

[Formula 3]

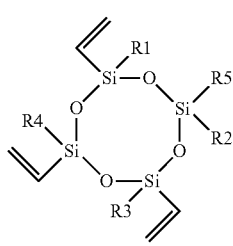

(3)

[Formula 4]

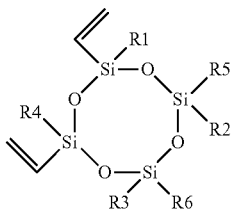

(4)

[Formula 5]

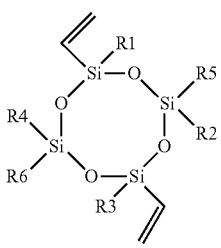

(5)

[Formula 6]

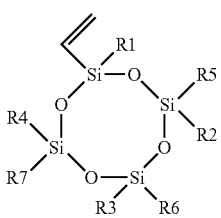

(6)

[Formula 7]

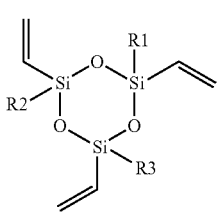

(7)

[Formula 8]

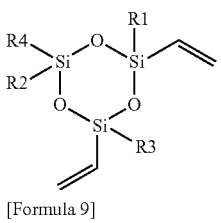

(8)

[Formula 9]

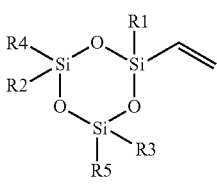

(9)

in Formulae (2) to (9), R1 to R7 are any of a vinyl group, an allyl group, a methyl group, an ethyl group, a propyl group, an isopropyl group and a butyl group, where R1 to R7 may be the same, or different from each other.

5. The method of manufacturing a semiconductor device as set forth in claim 1, wherein said organosiloxane is cyclic organosiloxane represented by Formulae (10) and (11) below:

[Formula 10]

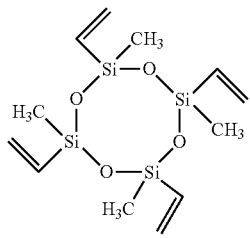

(10)

[Formula 11]

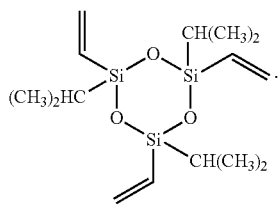

(11)

6. The method of manufacturing a semiconductor device as set forth in claim 1, wherein when any of the first insulating film and the second insulating film is/and formed, an oxidized gas is supplied together with said organosiloxane into a plasma generation apparatus which generates plasma of said organosiloxane.

7. The method of manufacturing a semiconductor device as set forth in claim 6, wherein said oxidized gas includes any one or more of oxygen ($O_2$), carbon dioxide ($CO_2$), nitrogen monoxide ($N_2O$) and nitrogen dioxide ($NO_2$).

8. The method of manufacturing a semiconductor device as set forth in claim 1, wherein the in-plane uniformity of thickness of said first insulating film at a point of time of starting to form said second insulating film is equal to or less than 4%.

9. The method of manufacturing a semiconductor device as set forth in claim 1, wherein the deposition rate of said first insulating film is equal to or less than 0.75 times the deposition rate of said second insulating film.

10. The method of manufacturing a semiconductor device as set forth in claim 1, wherein when the first insulating film is formed, said first insulating film having a thickness of equal to or more than 10 nm is formed.

11. The method of manufacturing a semiconductor device as set forth in claim 1, wherein when the first insulating film is formed, the deposition rate of said first insulating film is equal to or less than 90 nm/minute.

12. The method of manufacturing a semiconductor device as set forth in claim 1,
wherein when the first and second insulating films are formed, said first and second insulating films are respectively formed by applying high-frequency power into said plasma generation apparatus which generates plasma of said organosiloxane while said organosiloxane is supplied thereto, and
said high-frequency power applied to said plasma generation apparatus at forming the first insulating film is smaller than said high-frequency power applied to said plasma generation apparatus at forming the second insulating film.

13. The method of manufacturing a semiconductor device as set forth in claim 1,
wherein when the first and second insulating films are formed, said first and second insulating films are respectively formed by supplying an excitation gas and a carrier gas together with said organosiloxane into said plasma generation apparatus which generates plasma of said organosiloxane, and
the ratio ($a_2/(b_2+c_2)$) of the gas flow rate ($a_2$) of said organosiloxane to the sum ($b_2+c_2$) of the flow rate ($b_2$) of said carrier gas and the flow rate ($c_2$) of said excitation gas at forming the second insulating film is larger than the ratio ($a_1/(b_1+c_1)$) of the gas flow rate ($a_1$) of said organosiloxane to the sum ($b_1+c_1$) of the flow rate ($b_1$) of said carrier gas and the flow rate ($c_1$) of said excitation gas at forming the first insulating film.

14. The method of manufacturing a semiconductor device as set forth in claim 13, wherein when the first insulating film is formed, the ratio ($a_1/(b_1+c_1)$) of the gas flow rate of said organosiloxane to the sum of the flow rate of said carrier gas and the flow rate of said excitation gas is equal to or less than at least 0.15.

15. The method of manufacturing a semiconductor device as set forth in claim 14, wherein when the second insulating film is formed, said ratio ($a_2/(b_2+c_2)$) of the gas flow rate of said organosiloxane to the sum of the flow rate of said carrier gas and the flow rate of said excitation gas is equal to or more than at least 0.2.

16. The method of manufacturing a semiconductor device as set forth in claim 13,
wherein when the first and second insulating films are formed, said first and second insulating films are respectively formed by supplying an excitation gas, a carrier gas and an oxidized gas together with said organosiloxane into said plasma generation apparatus which generates plasma of said organosiloxane, and
the ratio ($d_1/(b_1+c_1)$) of the flow rate ($d_1$) of said oxidized gas to the sum ($b_1+c_1$) of the flow rate of said excitation gas and the flow rate of said carrier gas at forming the first insulating film is equal to or more than 0.06 and equal to or less than 0.2.

17. The method of manufacturing a semiconductor device as set forth in claim 13,
wherein when the first and second insulating films are formed, said first and second insulating films are respectively formed by supplying an excitation gas, a carrier gas and an oxidized gas together with said organosiloxane into said plasma generation apparatus which generates plasma of said organosiloxane, and
the ratio ($d_2/(b_2+c_2)$) of the flow rate ($d_2$) of said oxidized gas to the sum ($b_2+c_2$) of the flow rate of said carrier gas and the flow rate of said excitation gas at forming the second insulating film is equal to or more than 0.1 and equal to or less than 0.4.

18. The method of manufacturing a semiconductor device as set forth in claim 13, wherein when the second insulating film is formed, the flow rate of said excitation gas is reduced from the beginning of formation of the second insulating film.

19. The method of manufacturing a semiconductor device as set forth in claim 13, wherein the pressure within said plasma generation apparatus which generates plasma of said organosiloxane at forming the first insulating film is same with the pressure within said plasma generation apparatus at forming the second insulating film.

20. The method of manufacturing a semiconductor device as set forth in claim 1, wherein before forming the first insulating film is performed, the surface of said underlying film is processed by plasma including an inert gas.

21. The method of manufacturing a semiconductor device as set forth in claim 20, wherein said inert gas is any of helium, argon, and nitrogen.

22. The method of manufacturing a semiconductor device as set forth in claim 1,
wherein a uniform cyclic siloxiane material is supplied by the plasma polymerization between the start of forming the first insulating film and the end of forming the second insulating film.

23. The method of manufacturing a semiconductor device as set forth in claim 1,
wherein a deposition of material by plasma polymerization by said steps of forming said first insulating film and forming said second insulating film is not interrupted between the steps of forming said first insulating film and forming said second insulating film.

24. The method of manufacturing a semiconductor device as set forth in claim 1,
wherein, between said steps of forming said first insulating film and forming said second insulating film, a vacuum state is maintained and a supply of a cyclic organosiloxane is not stopped.

* * * * *

UNITED STATES PATENT AND TRADEMARK OFFICE
CERTIFICATE OF CORRECTION

PATENT NO. : 8,435,828 B2
APPLICATION NO. : 13/006034
DATED : May 7, 2013
INVENTOR(S) : Yamamoto et al.

Page 1 of 1

It is certified that error appears in the above-identified patent and that said Letters Patent is hereby corrected as shown below:

In the Claims

Column 25, line 38 "Si—0"

should be changed to --Si—O--.

Signed and Sealed this
Third Day of September, 2013

Teresa Stanek Rea
*Acting Director of the United States Patent and Trademark Office*